United States Patent
Oh et al.

(10) Patent No.: US 12,417,374 B2
(45) Date of Patent: Sep. 16, 2025

(54) NON-LINEAR ENCODING AND DECODING FOR RELIABLE WIRELESS COMMUNICATION

(71) Applicants: UNIVERSITY OF WASHINGTON, Seattle, WA (US); THE REGENTS OF THE UNIVERSITY OF MICHIGAN, Ann Arbor, MI (US); THE BOARD OF TRUSTEES OF THE UNIVERSITY OF ILLINOIS, Urbana, IL (US)

(72) Inventors: Sewoong Oh, Seattle, WA (US); Xiyang Liu, Seattle, WA (US); Hessam Mahdavifar, Ann Arbor, MI (US); Mohammad Vahid Jamali, Ann Arbor, MI (US); Pramod Viswanath, Champaign, IL (US); Ashok Makkuva, Champaign, IL (US)

(73) Assignees: University of Washington, Seattle, WA (US); The Regents of the University of Michigan, Ann Arbor, MI (US); The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 18/577,217

(22) PCT Filed: Jul. 6, 2022

(86) PCT No.: PCT/US2022/036251
§ 371 (c)(1),
(2) Date: Jan. 5, 2024

(87) PCT Pub. No.: WO2023/283262
PCT Pub. Date: Jan. 12, 2023

(65) Prior Publication Data
US 2025/0105859 A1    Mar. 27, 2025

Related U.S. Application Data

(60) Provisional application No. 63/219,264, filed on Jul. 7, 2021.

(51) Int. Cl.
*G06N 3/0455*     (2023.01)
*G06N 7/04*       (2006.01)
(Continued)

(52) U.S. Cl.
CPC .......... *G06N 3/0455* (2023.01); *G06N 7/046* (2013.01); *H03M 13/21* (2013.01); *H03M 13/611* (2013.01)

(58) Field of Classification Search
CPC ............................. G06N 3/0455; G06N 7/046
See application file for complete search history.

(56) References Cited

U.S. PATENT DOCUMENTS 9,059,739 B2    6/2015  Arikan
9,846,836 B2 *  12/2017 Gao ..................... G06N 3/045
(Continued)

FOREIGN PATENT DOCUMENTS

CN    104410593    3/2015
CN    105207749   12/2015
(Continued)

OTHER PUBLICATIONS

Chiu. Interleaved Polar (I-Polar) Codes.• In: Cornell University Library/ Computer Science/ Information Theory, Aug. 2, 2019, [online] [retrieved on Oct. 19, 2022 (Oct. 19, 2022)] Retrieved from the Internet< URL: https:ffarxiv.org/abs/1908.00708 >, entire document.
(Continued)

*Primary Examiner* — Joseph D Torres
(74) *Attorney, Agent, or Firm* — Christensen O'Connor Johnson Kindness PLLC

(57) ABSTRACT

A method of encoding a set of information bits to produce a codeword that encodes the set of information bits for
(Continued)

reliable communication is provided. The set of information bits is received. The set of information bits are provided to a plurality of permutation layers separated by neural network processing layers. Each permutation layer accepts an input vector and generates a reordered output vector that is a reordering of the input vector. Each neural network processing layer accepts a vector of input values and generates a vector of output values based on a non-linear function of the vector of input values. The reordered output vector of a final permutation layer of the plurality of permutation layers is provided as the codeword. In some embodiments, a corresponding method of decoding a codeword to retrieve a set of information bits is provided.

20 Claims, 24 Drawing Sheets

(51) Int. Cl.
  *H03M 13/00* (2006.01)
  *H03M 13/21* (2006.01)

(56) References Cited

U.S. PATENT DOCUMENTS

| | | | |
|---|---|---|---|
| 10,735,141 | B2 | 8/2020 | Bennatan |
| 10,970,441 | B1 | 4/2021 | Zhang |
| 2002/0090024 | A1 | 7/2002 | Tan |
| 2002/0106004 | A1 | 8/2002 | Tan |
| 2010/0077282 | A1 | 3/2010 | Shen |
| 2012/0185757 | A1 | 7/2012 | Jeong |
| 2017/0117945 | A1 | 4/2017 | Kim |
| 2018/0174042 | A1 | 6/2018 | Srinivasa |
| 2021/0111936 | A1 | 4/2021 | Sahin |
| 2022/0343152 | A1* | 10/2022 | Dai .................. G06N 3/047 |
| 2025/0125854 | A1* | 4/2025 | Liu .................. G06N 3/00 |

FOREIGN PATENT DOCUMENTS

| | | |
|---|---|---|
| CN | 110335217 | 10/2019 |
| CN | 112769858 | 5/2021 |
| CN | 113037726 | 6/2021 |
| CN | 113067672 | 7/2021 |
| JP | 2014138218 | 7/2014 |
| WO | 2021018402 | 2/2021 |

OTHER PUBLICATIONS

Abbe, E., Shpilka, A., and Wigderson, A. Reed-muller codes for random erasures and errors. IEEE Transactions on Information Theory, 61(10):5229-5252, 2015.
Abbe, E., Shpilka, A., and Ye, M. Reed-muller codes: Theory and algorithms, 2020. pp. 1-44.
Alon, N., Kaufman, T., Krivelevich, M., Litsyn, S., and Ron, D. Testing reed-muller codes. IEEE Transactions on Information Theory, 51(11):4032-4039, 2005.
Arikan, E. Channel polarization: A method for constructing capacity-achieving codes for symmetric binary-input memoryless channels. IEEE Transactions on information Theory, 55(7):3051-3073, 2009.
Cammerer, S., Gruber, T., Hoydis, J., and Ten Brink, S. Scaling deep learning-based decoding of polar codes via partitioning. In GLOBECOM 2017—2017 IEEE global communications conference, pp. 1-6. IEEE, 2017.
Carpi, F., Hager, C., Martalò, M., Raheli, R., and Pfister, H. D. Reinforcement learning for channel coding: Learned bit-flipping decoding. In 2019 57th Annual Allerton Conference on Communication, Control, and Computing (Allerton), pp. 922-929. IEEE, 2019.
Doan, N., Hashemi, S. A., and Gross, W. J. Neural successive cancellation decoding of polar codes. In 2018 IEEE 19th international workshop on signal processing advances in wireless communications (SPAWC), pp. 1-5. IEEE, 2018.
Dorner, S., Cammerer, S., Hoydis, J., and Ten Brink, S. Deep learning based communication over the air. IEEE Journal of Selected Topics in Signal Processing, 12(1): 132-143, 2017.
Dumer, I. Recursive decoding and its performance for lowrate reed-muller codes. IEEE Transactions on Information Theory, 50(5):811-823, 2004.
Dumer, I. Soft-decision decoding of reed-muller codes: a simplified algorithm. IEEE transactions on information theory, 52(3):954-963, 2006.
Dumer, I. and Shabunov, K. Near-optimum decoding for subcodes of reed-muller codes. In Proceedings. 2001 IEEE International Symposium on Information Theory, pp. 329. IEEE, 2001.
Dumer, I. and Shabunov, K. Soft-decision decoding of reed-muller codes: recursive lists. IEEE Transactions on information theory, 52(3):1260-1266, 2006.
Ebada, M., Cammerer, S., Elkelesh, A., and ten Brink, S. Deep learning-based polar code design. In 2019 57th Annual Allerton Conference on Communication, Control, and Computing (Allerton), pp. 177-183. IEEE, 2019.
Gruber, T., Cammerer, S., Hoydis, J., and ten Brink, S. On deep learning-based channel decoding. In 2017 51st Annual Conference on Information Sciences and Systems (CISS), pp. 1-6. IEEE, 2017.
Jamali, M. V., Liu, X., Makkuva, A. V., Mahdavifar, H., Oh, S., and Viswanath, P. Reed-Muller subcodes: Machine learning-aided design of efficient soft recursive decoding. arXiv preprint arXiv:2102.01671, 2021. pp. 1-8.
Jiang, Y., Kannan, S., Kim, H., Oh, S., Asnani, H., and Viswanath, P. Deepturbo: Deep turbo decoder. In 2019 IEEE 20th International Workshop on Signal Processing Advances in Wireless Communications (SPAWC), pp. 1-5. IEEE, 2019.
Jiang, Y., Kim, H., Asnani, H., Kannan, S., Oh, S., and Viswanath, P. Turbo autoencoder: Deep learning based channel codes for point-to-point communication channels. In Advances in Neural Information Processing Systems, 2019. pp. 1-11.
Jiang, Y., Kim, H., Asnani, H., Kannan, S., Oh, S., and Viswanath, P. Learn codes: Inventing low-latency codes via recurrent neural networks. IEEE Journal on Selected Areas in Information Theory, 2020. pp. 1-11.
Kaufman, T., Lovett, S., and Porat, E. Weight distribution and list-decoding size of reed-muller codes. IEEE transactions on information theory, 58(5):2689-2696, 2012.
Kim, H., Jiang, Y., Rana, R., Kannan, S., Oh, S., and Viswanath, P. Communication algorithms via deep learning. arXiv preprint arXiv:1805.09317, 2018. pp. 1-19.
Kim, H., Oh, S., and Viswanath, P. Physical layer communication via deep learning. IEEE Journal on Selected Areas in Information Theory, 2020. pp. 1-15.
Kudekar, S., Kumar, S., Mondelli, M., Pfister, H. D., Sasoglu, E., and Urbanke, R. L. Reed-muller codes achieve capacity on erasure channels. IEEE Transactions on information theory, 63(7):4298-4316, 2017.
Lapidoth, A. Nearest neighbor decoding for additive nongaussian noise channels. IEEE Transactions on Information Theory, 42(5):1520-1529, 1996.
Ma, Z., Xiao, M., Xiao, Y., Pang, Z., Poor, H. V., and Vucetic, B. High-reliability and low-latency wireless communication for internet of things: challenges, fundamentals, and enabling technologies. IEEE Internet of Things Journal, 6(5):7946-7970, 2019.
Nachmani, E., Be'ery, Y., and Burshtein, D. Learning to decode linear codes using deep learning. In 2016 54th Annual Allerton Conference on Communication, Control, and Computing (Allerton), pp. 341-346. IEEE, 2016.
Nachmani, E., Marciano, E., Lugosch, L., Gross, W. J., Burshtein, D., and Be'ery, Y. Deep learning methods for improved decoding of linear codes. IEEE Journal of Selected Topics in Signal Processing, 12(1):119-131, 2018.
O'Shea, T. J., Karra, K., and Clancy, T. C. Learning to communicate: Channel auto-encoders, domain specific regularizers, and attention. In 2016 IEEE International Symposium on Signal Processing and Information Technology (ISSPIT), pp. 223-228. IEEE, 2016.

(56) References Cited

OTHER PUBLICATIONS

O'shea, T. and Hoydis, J. An introduction to deep learning for the physical layer. IEEE Transactions on Cognitive Communications and Networking, 3(4):563-575, 2017.

Plotkin, M. Binary codes with specified minimum distance. IRE Transactions on Information Theory, 6(4):445-450, 1960.

Polyanskiy, Y., Poor, H. V., and Verdú, S. Channel coding rate in the finite blocklength regime. IEEE Transactions on Information Theory, 56(5):2307-2359, 2010.

Reed, I. A class of multiple-error-correcting codes and the decoding scheme. Transactions of the IRE Professional Group on Information Theory, 4(4):38-49, 1954.

Richardson, T. and Urbanke, R. Modern coding theory. Cambridge University Press, 2008. 590 pages.

Sason, I. and Shamai, S. Performance analysis of linear codes under maximum-likelihood decoding: A tutorial. 2006. 222 pages.

Sberlo, O. and Shpilka, A. On the performance of reedmuller codes with respect to random errors and erasures. In Proceedings of the Fourteenth Annual ACM-SIAM Symposium on Discrete Algorithms, pp. 1357-1376. SIAM, 2020.

Senior, A. W., Evans, R., Jumper, J., Kirkpatrick, J., Sifre, L., Green, T., Qin, C., Zidek, A., Nelson, A. W., Bridgland, A., et al. Protein structure prediction using multiple deep neural networks in the 13th critical assessment of protein structure prediction (casp13). Proteins: Structure, Function, and Bioinformatics, 87(12):1141-1148, 2019.

Shannon, C. E. A mathematical theory of communication. The Bell system technical journal, 27(3):379-423, 1948.

Silver, D., Hubert, T., Schrittwieser, J., Antonoglou, I., Lai, M., Guez, A., Lanctot, M., Sifre, L., Kumaran, D., Graepel, T., et al. A general reinforcement learning algorithm that masters chess, shogi, and go through self-play. Science, 362(6419):1140-1144, 2018.

Sybis, M., Wesolowski, K., Jayasinghe, K., Venkatasubramanian, V., and Vukadinovic, V. Channel coding for ultrareliable low-latency communication in 5g systems. In 2016 IEEE 84th vehicular technology conference (VTCFall), pp. 1-5. IEEE, 2016.

Tal, I. and Vardy, A. How to construct polar codes. IEEE Trans. Inf. Theory, 59(10):6562-6582, 2013.

Tal, I. and Vardy, A. List decoding of polar codes. IEEE Transactions on Information Theory, 61(5):2213-2226, 2015.

Udrescu, S.-M. and Tegmark, M. Ai feynman: A physicsinspired method for symbolic regression. Science Advances, 6(16):eaay2631, 2020. pp. 1-16.

Welling, M. Neural augmentation in wireless communication, 2020. 32 pages.

Xu, W., Wu, Z., Ueng, Y.-L., You, X., and Zhang, C. Improved polar decoder based on deep learning. In 2017 IEEE International workshop on signal processing systems (SiPS), pp. 1-6. IEEE, 2017.

Ye, M. and Abbe, E. Recursive projection-aggregation decoding of reed-muller codes. IEEE Transactions on Information Theory, 66(8):4948-4965, 2020.

Xu, H. "Semi-supervised manifold learning based on polynomial mapping for localization in wireless sensor networks," Elsevier: Signal Processing vol. 172, Jul. 2020, 107570.

Marshall, T. "Coding of Real-Number Sequences for Error Correction: A Digital Signal Processing Problem," IEEE Journal on Selected Areas in Communications ( vol. 2, Issue: 2, Mar. 1984), pp. 381-392.

Z. Han, X. Yuan, C. Xu, S. Jiang and X. Wang, "Sparse Kronecker-Product Coding for Unsourced Multiple Access," in IEEE Wireless Communications Letters, vol. 10, No. 10, pp. 2274-2278, Oct. 2021, doi: 10.1109/LWC.2021.3099285.

R. D. J. van Nee, "OFDM codes for peak-to-average power reduction and error correction," Proceedings of GLOBECOM'96. 1996 IEEE Global Telecommunications Conference, London, UK, 1996, pp. 740-744 vol. 1, doi: 10.1109/GLOCOM.1996.594459.

R. Zhang, F. Liu, Z. Zeng, Q. Shang and S. Zhao, "Neural Network Based Successive Cancellation Decoding Algorithm for Polar Codes in URLLC," 2019 16th International Symposium on Wireless Communication Systems (ISWCS), Oulu, Finland, 2019, pp. 182-187, doi: 10.1109/ISWCS.2019.8877103.

T. V. Luong, Y. Ko, M. Matthaiou, N. A. Vien, M.-T. Le and V.-D. Ngo, "Deep Learning-Aided Multicarrier Systems," in IEEE Transactions on Wireless Communications, vol. 20, No. 3, pp. 2109-2119, Mar. 2021, doi: 10.1109/TWC.2020.3039180.

Makkuva, A. V et al. "KO codes: inventing nonlinear encoding and decoding for reliable wireless communication via deep-learning," Proceedings of the 38th International Conference on Machine Learning, PMLR 139:7368-7378, 2021.

International Search Report and Writen Opinion mailed on Nov. 21, 2022, issued in PCT/US2022/36251, filed on Jul. 6, 2022; 12 pages.

\* cited by examiner

NON-LINEAR ENCODING AND DECODING FOR RELIABLE WIRELESS COMMUNICATION

CROSS-REFERENCE TO RELATED APPLICATION APPLICATIONS

This application is a National Stage of International Application No. PCT/US2022/036251, filed Jul. 6, 2022, which claims the benefit of Provisional Application No. 63/219,264, filed Jul. 7, 2021, the entire disclosures of which are hereby incorporated by reference herein for all purposes.

STATEMENT OF GOVERNMENT LICENSE RIGHTS

This invention was made with Government support under Grant No. 1909771, awarded by the National Science Foundation. The Government has certain rights in the invention.

BACKGROUND

Physical layer communication underpins the information age (WiFi, cellular, cable and satellite modems). Codes, composed of encoder and decoder pairs, enable reliable communication: encoder maps original data bits into a longer sequence, and decoders map the received sequence to the original bits. Reliability is precisely measured: bit error rate (BER) measures the fraction of input bits that were incorrectly decoded; block error rate (BLER) measures the fraction of times at least one of the original data bits was incorrectly decoded.

Landmark codes include Reed-Muller (RM), BCH, Turbo, LDPC and Polar codes (Richardson & Urbanke, 2008): each is a linear code and represents a mathematical breakthrough discovered over a span of six decades. The impact on humanity is huge: each of these codes has been used in global communication standards over the past six decades. These codes essentially operate at the information-theoretic limits of reliability over the additive white Gaussian noise (AWGN) channel, when the number of information bits is large, the so-called "large block length" regime.

In the small and medium block length regimes, the state-of-the-art codes are algebraic: encoders and decoders are invented based on specific linear algebraic constructions over the binary and higher order fields and rings. Especially prominent binary algebraic codes are RM codes and closely related polar codes, whose encoders are recursively defined as Kronecker products of a simple linear operator and constitute the state of the art in small-to-medium block length regimes.

Determining new codes for emerging practical applications, e.g., low block length regime in Internet of Things applications (Ma et al., 2019), is an area of frequent research. One difficult challenge in determining new codes is that the space of codes is very vast and the sizes astronomical. For instance, a rate 1/2 code over even 100 information bits involves designing $2^{100}$ codewords in a 200-dimensional space. Computationally efficient encoding and decoding procedures are highly desired, in addition to high reliability. Thus, although a random code is information theoretically optimal, neither encoding nor decoding is computationally efficient.

The mathematical landscape of computationally efficient codes has been plumbed over the decades by some of the finest mathematical minds, resulting in two distinct families of codes: algebraic codes (RM, Polar, BCH-focused on properties of polynomials) and graph codes (Turbo, LDPC-based on sparse graphs and statistical physics). The former is deterministic and involves discrete mathematics, while the latter harnesses randomness, graphs, and statistical physics to behave like a pseudorandom code. A major open question is the invention of new codes, and especially fascinating would be a family of codes outside of these two classes.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments, a method of encoding a set of information bits to produce a codeword that encodes the set of information bits for reliable communication is provided. The set of information bits is received. The set of information bits are provided to a plurality of permutation layers separated by neural network processing layers. Each permutation layer accepts an input vector and generates a reordered output vector that is a reordering of the input vector. Each neural network processing layer accepts a vector of input values and generates a vector of output values based on a non-linear function of the vector of input values. The reordered output vector of a final permutation layer of the plurality of permutation layers is provided as the codeword.

In some embodiments, a method of reliable wireless transmission of a set of information bits is provided. A set of information bits to be transmitted is determined and encoded in a codeword using the encoding method described above. The codeword is wirelessly transmitted.

In some embodiments, a method of decoding a codeword to retrieve a set of information bits is provided. The codeword is received, and is provided to a plurality of permutation layers separated by neural network processing layers. Each permutation layer accepts an input vector and generates a reordered output vector that is a reordering of the input vector. Each neural network processing layer accepts a vector of input values and generates a vector of output values based on a non-linear function of the vector of input values. A plurality of forward calculations and backward calculations are performed using the plurality of permutation layers separated by the neural network processing layers to retrieve the set of information bits.

In some embodiments, a method of reliable wireless reception of a set of information bits is provided. The codeword is wirelessly received. A set of information bits is decoded from the codeword using the decoding method described above.

In some embodiments, a method of training an encoder and a decoder is provided. An encoder is initialized, the encoder comprising a first plurality of first permutation layers separated by first neural network processing layers. Each first permutation layer accepts an input vector and generates a reordered output vector that is a reordering of the input vector. Each first neural network processing layer accepts a vector of input values and generates a vector of output values based on a non-linear function of the vector of input values. A decoder is initialized, the decoder comprising a second plurality of second permutation layers separated by second neural network processing layers. Each second permutation layer accepts an input vector and generates a reordered output vector that is a reordering of the input vector. Each second neural network processing layer accepts a vector of input values and generates a vector of output values based on a non-linear function of the vector of input values. A first number of optimization steps for the decoder are performed using a set of training data. A second number of optimization steps for the encoder are performed using the set of training data. The first number of optimization steps for the decoder and the second number of optimization steps for the encoder are repeated until training of the encoder and the decoder is completed.

In some embodiments, a computer-readable medium is provided. The computer-readable medium has computer-executable instructions stored thereon that, in response to execution by one or more processors of a computing device, cause the computing device to perform actions of a method as described above.

In some embodiments, a computing device is provided. The computing device comprises at least one processor; and a non-transitory computer-readable medium having computer-executable instructions stored thereon. The instructions, in response to execution by the at least one processor, cause the computing device to perform actions of a method as described above.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The present disclosure provides a new family of codes, called KO codes, that have features of both code families: they are nonlinear generalizations of the Kronecker operation underlying the algebraic codes (RM, Polar) parameterized by neural networks. The parameters are learned in an end-to-end training paradigm in a data driven manner.

A linear encoder is defined by a generator matrix, which maps information bits to a codeword. The RM and the Polar families construct their generator matrices by recursively applying the Kronecker product operation to a simple two-by-two matrix and then selecting rows from the resulting matrix. The careful choice in selecting these rows is driven by the desired algebraic structure of the code, which is central to achieving the large minimum pairwise distance between two codewords, a hallmark of the algebraic family. This encoder can be alternatively represented by a computation graph. The recursive Kronecker product corresponds to a complete binary tree, and row-selection corresponds to freezing a set of leaves in the tree, which we refer to as a "Plotkin tree," inspired by the pioneering construction in (Plotkin, 1960).

The Plotkin tree skeleton allows us to tailor a new neural network architecture: we expand the algebraic family of codes by replacing the (linear) Plotkin construction with a non-linear operation parametrized by neural networks. The parameters are discovered by training the encoder with a matching decoder, that has the matching Plotkin tree as a skeleton, to minimize the error rate over (the unlimited) samples generated on AWGN channels.

Algebraic and the original RM/Polar codes promise a large worst-case pairwise distance (Alon et al., 2005). This ensures that RM/Polar codes achieve capacity in the large block length limit (Arikan, 2009; Kudekar et al., 2017). However, for short block lengths, they are too conservative, as we are interested in the average-case reliability. This is the gap KO codes as described in the present disclosure exploit: we seek a better average-case reliability and not the minimum pairwise distance.

Figure 1:
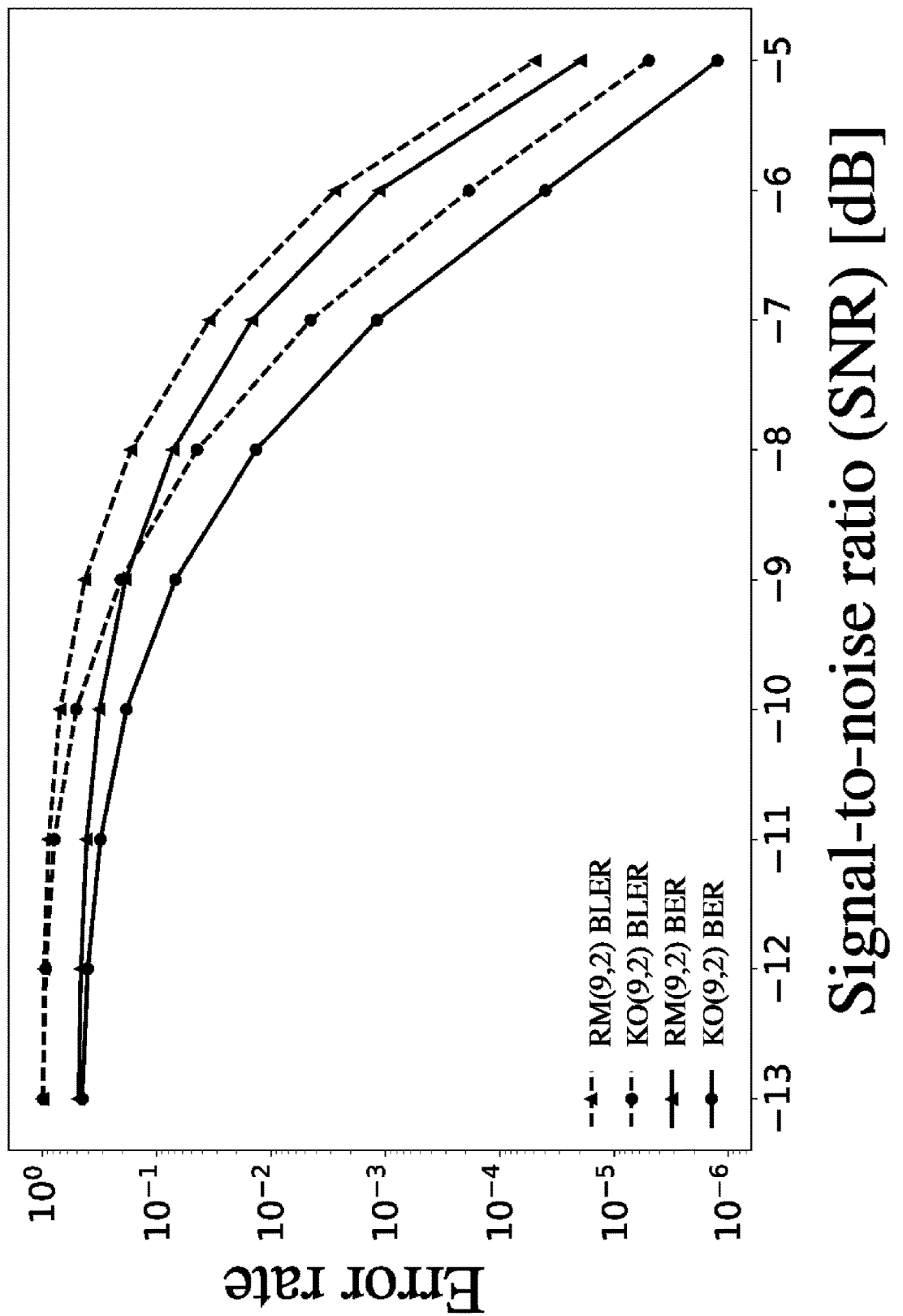
FIG. 1 illustrates the gain for the example of RM (9, 2) code compared to the KO (9, 2) code according to various aspects of the present disclosure.

FIG. 1 illustrates the gain for the example of RM (9, 2) code compared to the KO (9, 2) code according to various aspects of the present disclosure. Using the Plotkin tree of RM (9, 2) code as a skeleton, we design the KO (9, 2) code architecture and train on samples simulated over an AWGN channel.

We discover a novel non-linear code and a corresponding efficient decoder that improves significantly over the RM (9, 2) code baseline, assuming both codes are decoded using successive cancellation decoding with similar decoding complexity. In FIG. 1, it is shown that KO(9, 2) significantly improves upon state of the art RM(9, 2), both in BER and BLER. For both codes, the code block length is $2^9=512$ and the number of transmitted messaggge bits is $$\binom{9}{0}+\binom{9}{1}+\binom{9}{2}=55.$$

Also, both codes are decoded using message bits is successive cancellation decoding with similar decoding complexity.

Analyzing the pairwise distances between two codewords reveals a surprising fact. The histogram for KO code nearly matches that of a random Gaussian codebook. This is in contrast to the RM (9, 2) code, which has discrete peaks at several values. The skeleton of the architecture from an algebraic family of codes, the training process with a variation of the stochastic gradient descent, and the simulated AWGN channel have worked together to discover a novel family of codes that harness the benefits of both algebraic and pseudorandom constructions.

In summary, the present disclosure includes at least the following: We introduce novel neural network architectures for the (encoder, decoder) pair that generalizes the Kronecker operation central to RM/Polar codes. We propose training methods that discover novel non-linear codes when trained over AWGN and provide empirical results showing that this family of non-linear codes improves significantly upon the baseline code it was built on (both RM and Polar codes) whilst having the same encoding and decoding complexity.

Interpreting the pairwise distances of the discovered codewords reveals that a KO code mimics the distribution of codewords from the random Gaussian codebook, which is known to be reliable but computationally challenging to decode. The decoding complexities of KO codes are O(n log n) where n is the block length, matching that of efficient decoders for RM and Polar codes.

We highlight that the design principle of KO codes serves as a general recipe to discover new family of non-linear codes improving upon their linear counterparts. In particular, the construction is not restricted to a specific decoding algorithm, such as successive cancellation (SC). In the present disclosure, we focus on the SC decoding algorithm since it is one of the most efficient decoders for the RM and Polar family. At this decoding complexity, i.e. O(n log n), our results demonstrate that we achieve significant gain over these codes. Our preliminary results show that KO codes achieve similar gains over the RM codes, when both are decoded with list-decoding.

Problem Formulation

We formally define the channel coding problem and provide background on Reed-Muller codes, the inspiration for our approach. Our notation is the following. We denote Euclidean vectors by bold face letters like m, L, etc. For $L \in \mathbb{R}^n$, $L_{k:m} \triangleq (L_k, \ldots, L_m)$. If $v \in \{0, 1\}$, we define the operator $\oplus_v$ as $x \oplus_v y \triangleq x+(-1)^v y$.

With regard to channel coding, let $m=(m_1, \ldots, m_k) \in \{0, 1\}^k$ denote a block of information message bits that we want to transmit. An encoder $g_\theta(\cdot)$ is a function parametrized by $\theta$ that maps these information bits into a binary vector x of length n, i.e. $x=g_\theta(m) \in \{0, 1\}^n$. The rate $\rho=k/n$ of such a code measures how many bits of information we are sending per channel use. These codewords are transformed into real (or complex) valued signals, called modulation, before being transmitted over a channel. For example, Binary Phase Shift Keying (BPSK) modulation maps each $x_i \in \{0, 1\}$ to $1-2x_i \in \{\pm 1\}$ up to a universal scaling constant for all $i \in [n]$. Here, we do not strictly separate encoding from modulation and refer to both binary encoded symbols and real-valued transmitted symbols as codewords.

Upon transmission of this codeword x across a noisy channel $P_{Y|X}(\cdot|\cdot)$, we receive its corrupted version $y \in \mathbb{R}^n$. The decoder $f_\phi(\cdot)$ is a function parametrized by $\phi$ that subsequently processes the received vector y to estimate the information bits $\hat{m}=f_\phi(y)$. The closer $\hat{m}$ is to m, the more reliable the transmission.

An error metric, such as Bit-Error-Rate (BER) or Block-Error-Rate (BLER), gauges the performance of the encoder-decoder pair $(g_\theta, f_\phi)$. Note that BER is defined as BER $\triangleq (1/k) \Sigma_i \mathbb{P}[\hat{m}_i \neq m_i]$, whereas BLER $\triangleq \mathbb{P}[\hat{m} \neq m]$.

The design of good codes given a channel and a fixed set of code parameters (k, n) can be formulated as:

$$(\theta, \phi) \in \arg\min_{\theta, \phi} BER(g_\theta, f_\phi)$$

which is a joint classification problem for k binary classes, and we train on the surrogate loss of cross entropy to make the objective differentiable. While classical optimal codes such as Turbo, LDPC, and Polar codes all have linear encoders, appropriately parametrizing both the encoder $g_\theta(\cdot)$ and the decoder $f_\phi(\cdot)$ by neural networks (NN) allows for a much broader class of codes, especially non-linear codes. However, in the absence of any structure, NNs fail to learn non-trivial codes and end up performing worse than simply repeating each message bit n/k times (Kim et al., 2018; Jiang et al., 2019b).

A fundamental question in machine learning for channel coding is thus: how do we design architectures for our neural encoders and decoders that give the appropriate inductive bias? To gain intuition towards addressing this, we focus on Reed-Muller (RM) codes. Below, we present a novel family of non-linear codes (KO codes) that strictly generalize and improve upon RM codes by capitalizing on their inherent recursive structure. Our approach seamlessly generalizes to Polar codes, as explained in detail below.

Reed-Muller (RM) Codes

RM codes are a family of codes parametrized by a variable size $m \in \mathbb{Z}_+$ and an order $r \in \mathbb{Z}_+$ with $r \le m$, denoted as RM(m, r). It is defined by an encoder, which maps binar information bits $m \in \{0, 1\}^k$ to codewords $x \in \{0, 1\}^n$. RM(m, r) code sends $$k = \sum_{i=0}^{r} \binom{m}{i}$$

information bits with $n = 2^m$ transmissions. The code distance measures the minimum distance between all (pairs of) codewords. These parameters are summarized as follows:

| Code length | Code dimension | Rate | Distance |
|---|---|---|---|
| $n = 2^m$ | $k = \sum_{i=0}^{r} \binom{m}{i}$ | $\rho = k/n$ | $d = 2^{m-r}$ |

One way to define RM(m, r) is via the recursive application of a Plotkin construction. The basic building block is a mapping Plotkin: $\{0, 1\}^{\ell} \times \{0, 1\}^{\ell} \rightarrow \{0, 1\}^{2\ell}$, where:

Plotkin$(u,v) = (u, u \oplus v)$ with $\oplus$ representing a coordinate-wise XOR and ($\cdot$, $\cdot$) denoting concatenation of two vectors (Plotkin, 1960). Plotkin (1960) proposed this scheme in order to combine two codes of smaller code lengths and construct a larger code with the following properties. It is relatively easy to construct a code with either a high rate but a small distance (such as sending the raw information bits directly) or a large distance but a low rate (such as repeating each bit multiple times). Plotkin construction combines such two codes of rates $\rho_u > \rho_v$ and distances $d_u < d_v$, to design a larger block length code satisfying rate $\rho = (\rho_u + \rho_v)/2$ and distance min$\{2d_u, d_v\}$. This significantly improves upon a simple time-sharing of those codes, which achieves the same rate but distance only min$\{d_u, d_v\}$.

Note: Following the standard convention, we fix the leaves in the Plotkin tree of a first order RM(m, 1) code to be zeroth order RM codes and the full-rate RM(1, 1) code. On the other hand, a second order RM(m, 2) code contains the first order RM codes and the full-rate RM(2, 2) as its leaves.

In view of the Plotkin construction, RM codes are recursively defined as a set of codewords of the form:

$$RM(m, r) = \{(u, u \oplus v) : u \in RM(m-1, r), v \in RM(m-1, r-1)\}$$

where RM(m, 0) is a repetition code that repeats a single information bit $2^m$ times, i.e., x=(m1, m1, . . . m1).

When r=m, the full-rate RM(m, m) code is also recursively defined as a Plotkin construction of two RM(m−1, m−1) codes. Unrolling the recursion in the above equation, an RM(m, r) encoder can be represented by a corresponding (rooted and binary) computation tree, which we refer to as its Plotkin tree. In this tree, each branch represents a Plotkin mapping of two codes of appropriate lengths, recursively applied from the leaves to the root.

Figures 2A, 2B:
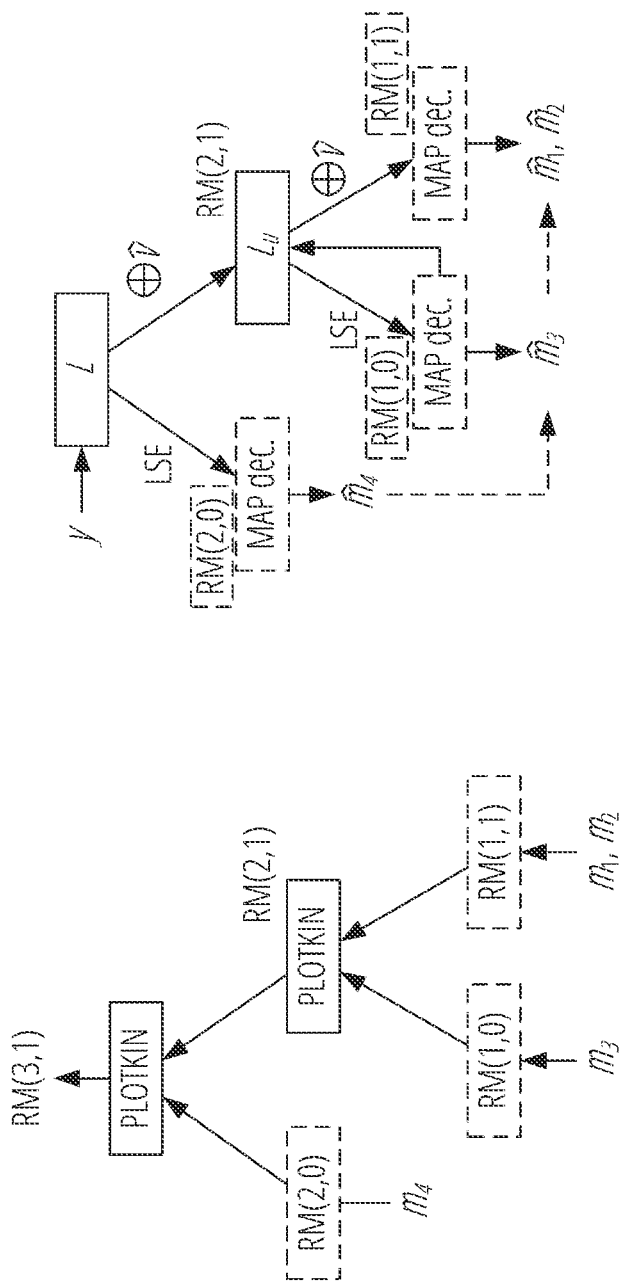
FIG. 2A illustrates a Plotkin tree decomposition of an RM (3, 1) encoder.
FIG. 2B illustrates a Dumer's recursive decoding technique for an RM (3, 1) code.

FIG. 2A illustrates such a Plotkin tree decomposition of an RM(3, 1) encoder. In FIG. 2A, boxes illustrated with dashed lines are leaf nodes of the tree. Encoding starts from the bottom right leaves. The leaf RM(1, 0) maps $m_3$ to ($m_3$, $m_3$) (repetition), and another leave RM(1, 1) maps ($m_1$, $m_2$) to ($m_1$, $m_1 \oplus m_2$) (Plotkin mapping of two RM(0, 0) codes. Each branch in this tree performs the Plotkin construction of Plotkin(u, v) described above.

The next operation is the parent of these two leaves, which performs Plotkin (RM(1, 1), RM(1, 0))=Plotkin(($m_1$, $m_1 \oplus m_2$), ($m_3$, $m_3$)) which outputs the vector ($m_1$, $m_1 \oplus m_2$, $m_1 \oplus m_3$, $m_1 \oplus m_2 \oplus m_3$), which is known as RM(2, 1) code. This coordinate-wise Plotkin construction is applied recursively one more time to combine RM(2, 0) and RM(2, 1) at the root for the tree. The resulting codewords are RM(3, 1)=Plotkin(RM(2, 1), RM(2, 0))=Plotkin(($m_1$, $m_1 \oplus m_2$, $m_i \oplus m_3$, $m_1 \oplus m_2 \oplus m_3$), ($m_4$, $m_4$, $M_4$, $m_4$)).

This recursive structure of RM codes both inherits the good minimum distance property of the Plotkin construction and enables efficient decoding.

With regard to decoding, there have been several decoders developed for RM codes. The most efficient RM code decoder is called Dumer's recursive decoding (Dumer, 2004; 2006; Dumer & Shabunov, 2006b) that fully capitalizes on the recursive Plotkin construction explained above. The basic principle is: to decode an RM codeword x=(u, u⊕v)∈RM(m, r), we first recursively decode the left sub-codeword v∈RM(m−1, r−1) and then the right sub-codeword u∈RM(m−1, r), and we use them together to stitch back the original codeword. This recursion is continued until we reach the leaf nodes, where we perform maximum a posteriori (MAP) decoding. Dumer's recursive decoding is also referred to as successive cancellation decoding in the context of polar codes (Arikan, 2009).

FIG. 2B illustrates this decoding procedure for RM(3, 1). Dumer's decoding starts at the root and uses the soft-information of codewords to decode the message bits. Suppose that the message bits m=($m_1$, . . . , $m_4$) are encoded into an RM(3, 1) codeword $x \in \{0, 1\}^8$ using the Plotkin encoder in FIG. 2A. Let $y \in \mathbb{R}^8$ be the corresponding noisy codeword received at the decoder. To decode the bits m, we first obtain the soft-information of the codeword x, i.e., we compute its Log-Likelihood-Ratio (LLR) $L \in \mathbb{R}^8$:

$$L_i = \log \frac{P[y_i \mid x_i = 0]}{P[y_i \mid x_i = 1]}, i = 1, \ldots, 8.$$

We next use L to compute soft-information for its left and right children: the RM(2, 0) codeword v and the RM(2, 1) codeword u. We start with the left child v.

Since the codeword x=(u, u⊕v), we can also represent its left child as v=u⊕(u⊕v)=$x_{1:4} \oplus x_{5:8}$. Hence its LLR vector $L_v \in \mathbb{R}^4$ can be readily obtained from that of x. In particular it is given by the log-sum-exponential transformation: $L_v$=LSE($L_{1:4}$, $L_{5:8}$), where LSE(a, b) $\triangleq \log((1+e^{a+b})/(e^a+e^b))$ for a, b$\in \mathbb{R}$. Since this feature $L_v$ corresponds to a repetition code, $v=(m_4, m_4, m_4)$), majority decoding (same as the MAP) on the sign of $L_v$ yields the decoded message bit as $\hat{m}_4$. Finally, the left codeword is decoded as $\hat{v}=(\hat{m}_4, \hat{m}_4, \hat{m}_4, \hat{m}_4)$.

Having decoded the left RM(2, 0) codeword $\hat{v}$, our goal is to now obtain soft-information $L_u \in \mathbb{R}^4$ for the right RM(2, 1) codeword u. Fixing $v=\hat{v}$, notice that the codeword $x=(u, u \oplus \hat{v})$ can be viewed as a 2-repetition of u depending on the parity of $\hat{v}$. Thus the LLR $L_u$ is given by LLR addition accounting for the parity of $\hat{v}$: $L_u = L_{1:4} \oplus \hat{v} L_{5:8} = L_{1:4} + (-1)^{\hat{v}} L_{5:8}$. Since RM(2, 1) is an internal node in the tree, we again recursively decode its left child RM(1, 0) and its right child RM(1, 1), which are both leaves. For RM(1, 0), decoding is similar to that of RM(2, 0) above, and we obtain its information bit $\hat{m}_3$ by virt applying the log-sum-exponential function on the feature $L_u$ and then majority decoding. Likewise, we obtain the LLR feature $L_{uu} \in \mathbb{R}^2$ for the right RM(1, 1) child using parity-adjusted LLR addition on $L_u$. Finally, we decode its corresponding bits $(\hat{m}_1, \hat{m}_2)$ using efficient MAP-decoding of first order RM codes (abbe et al., 2020). Thus we obtain the full block of decoded message bits as $\hat{m}=(\hat{m}_1, \hat{m}_2, \hat{m}_3, \hat{m}_4)$.

An important observation from Dumer's algorithm is that the sequence of bit decoding in the tree is RM(2, 0)→RM(1, 0)→RM(1, 1). A similar decoding order holds for all RM(m, 2) codes, where all the left leaves (order-1 codes) are decoded first from top to bottom, and the right-most leave (full-rate RM(2, 2)) is decoded at the end.

KO Codes

We design KO codes using the Plotkin tree as the skeleton of a new neural network architecture, which strictly improve upon their classical counterparts.

Figures 2C, 2D:
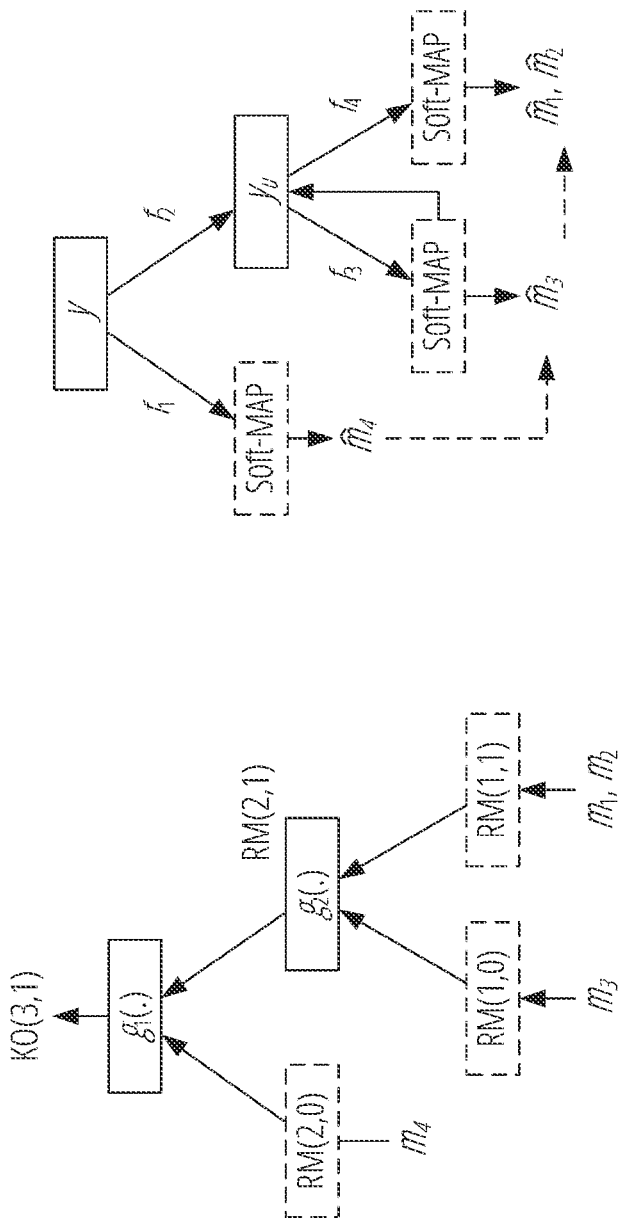
FIG. 2C illustrates a non-limiting example embodiment of a Plotkin tree decomposition of a KO (3, 1) encoder according to various aspects of the present disclosure.
FIG. 2D illustrates a non-limiting example embodiment of a decoder for a KO (3, 1) code according to various aspects of the present disclosure.

Earlier we saw the design of RM codes via recursive Plotkin mapping. Inspired by this elegant construction, we present a new family of codes, called KO codes, denoted as KO(m, r, $g_\theta$, $f_\phi$). These codes are parametrized by a set of four parameters: a non-negative integer pair (m, r), a finite set of encoder neural networks $g_\theta$, and a finite set of decoder neural networks $f_\phi$. In particular, for any fixed pair (m, r), our KO encoder inherits the same code parameters (k, n, $\rho$) and the same Plotkin tree skeleton of the RM encoder. However, a critical distinguishing component of the KO(m, r) encoder disclosed herein is a set of encoding neural networks $g_\theta = \{g_i\}$ that strictly generalize the Plotkin mapping: to each internal node i of the Plotkin tree, we associate a neural network $g_i$ that applies a coordinate-wise real valued nonlinear mapping (u v) $\mapsto g_i(u, v) \in \mathbb{R}^{2\ell}$ as opposed to the classical binary valued Plotkin mapping (u, v) $\mapsto$ (u, u⊕v) $\in \{0, 1\}^{2\ell}$. FIG. 2C illustrates this for the KO(3, 1) encoder.

The significance of our KO encoder $g_\theta$ is that by allowing for general nonlinearities $g_i$ to be learnt at each node we enable for a much richer and broader class of nonlinear encoders and codes to be discovered on a whole, which contribute to non-trivial gains over standard RM codes. Further, we have the same encoding complexity as that of an RM encoder since each $g_i: \mathbb{R}^2 \to \mathbb{R}$ is applied coordinate-wise on its vector inputs. The $\mathbb{R}$ parameters of these neural networks $g_i$ are trained via stochastic gradient descent on the cross entropy loss. Further details of a non-limiting example embodiment of a training technique are provided below.

The present disclosure also provides an efficient family of decoders to match the KO encoder described above. Inspired by the Dumer's decoder, we present a new family of KO decoders that fully capitalize on the recursive structure of KO encoders via the Plotkin tree. Our KO decoder has at least three distinct features:

(i) Neural decoder: The KO decoder architecture is parametrized by a set of decoding neural networks $f_\phi = \{(f_{2i-1}, f_{2i})\}$. Specifically, to each internal node i in the tree, we associate $f_{2i-1}$ to its left branch whereas $f_{2i}$ corresponds to the right branch. FIG. 2D illustrates this for the KO(3, 1) decoder. The pair of decoding neural networks $(f_{2i-1}, f_{2i})$ can be viewed as matching decoders for the corresponding encoding network $g_i$: While $g_i$ encodes the left and right codewords arriving at this node, the outputs of $f_{2i-1}$ and $f_{2i}$ represent appropriate Euclidean feature vectors for decoding them. Further, $f_{2i-1}$ and $f_{2i}$ can also be viewed as a generalization of Dumer's decoding to nonlinear real codewords: $f_{2i-1}$ generalizes the LSE function, while $f_{2i}$ extends the operation $\oplus_{\hat{v}}$. Note that both the functions $f_{2i-1}$ and $f_{2i}$ are also applied coordinate-wise and hence we inherit the same decoding complexity as Dumer's.

(ii) Soft-MAP decoding: Since the classical MAP decoding to decode the bits at the leaves is not differentiable, we design a new differentiable counterpart, the Soft-MAP decoder. Soft-MAP decoder enables gradients to pass through it, which is crucial for training the neural (encoder, decoder) pair ($g_\theta$, $f_\phi$) in an end-to-end manner.

(iii) Channel agnostic: Our decoder directly operates on the received noisy codeword $y \in \mathbb{R}^n$ while Dumer's decoder uses its LLR transformation $L \in \mathbb{R}^n$. Thus, our decoder can learn the appropriate channel statistics for decoding directly from y alone; in contrast, Dumer's algorithm requires precise channel characterization, which is not usually known.

KO(8, 2) Architecture

Figure 3A:
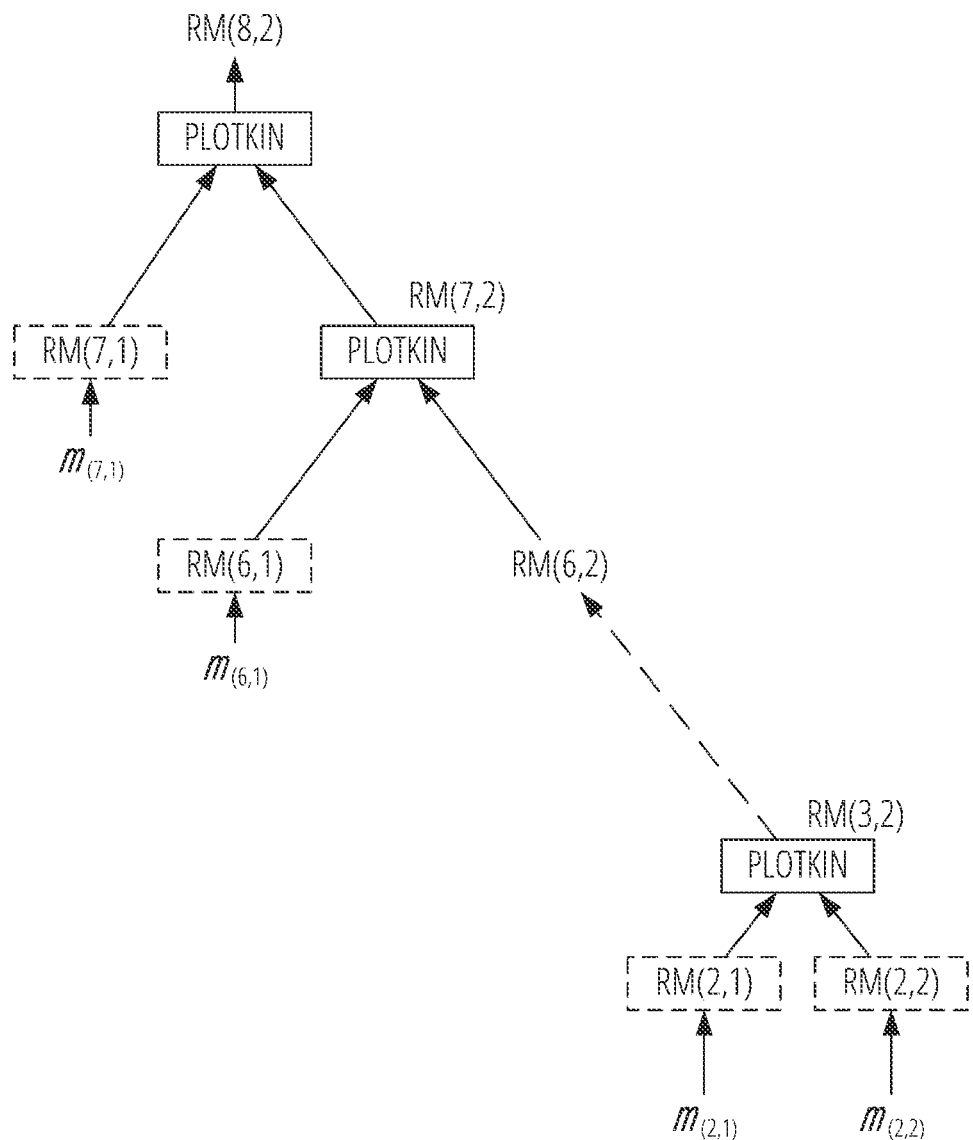
FIG. 3A is a schematic drawing that illustrates a Plotkin tree for a second order RM (8, 2) encoder.
Figure 3B:
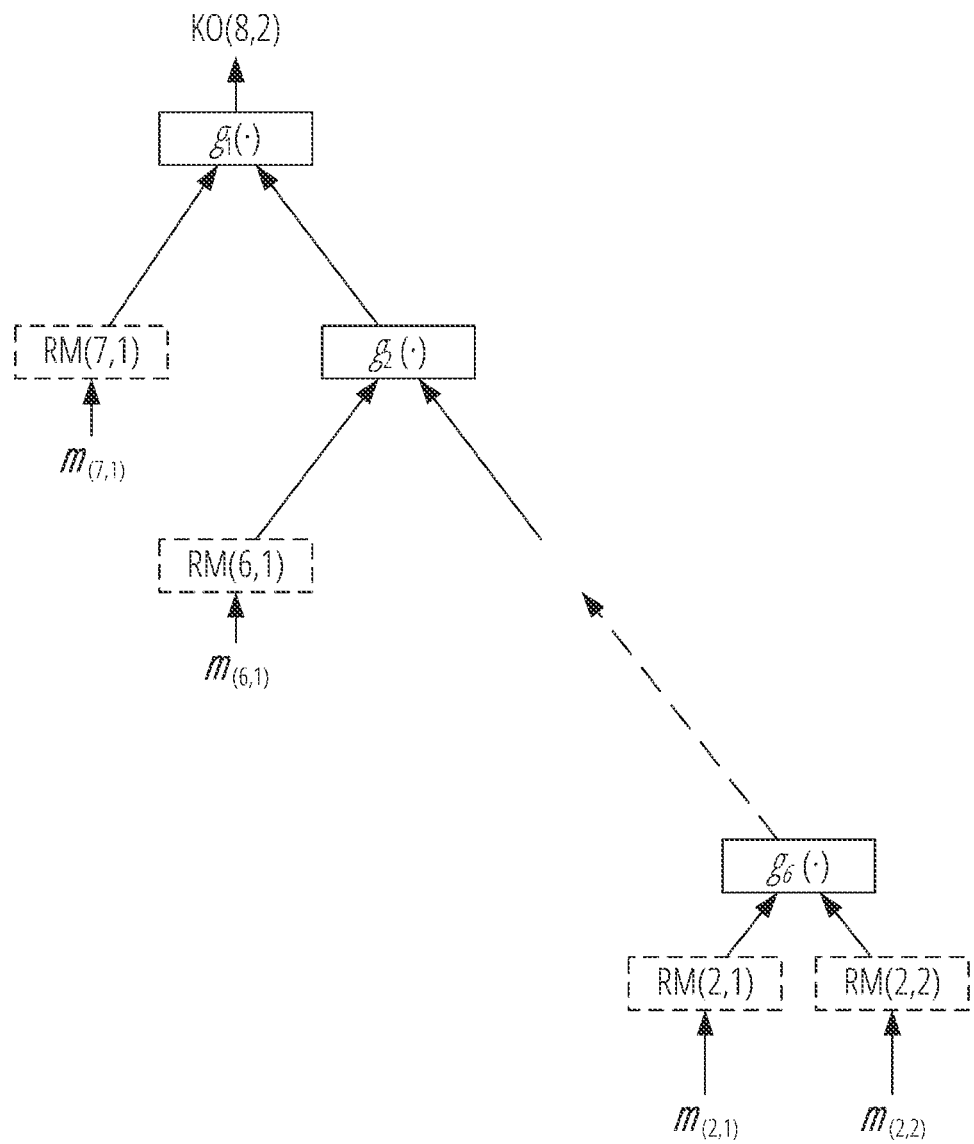
FIG. 3B is a schematic drawing that illustrates a Plotkin tree for a non-limiting example embodiment of a KO (8, 2) encoder according to various aspects of the present disclosure.

The KO codes disclosed herein improve significantly on RM codes on a variety of benchmarks. FIG. 3A is a schematic drawing that illustrates a Plotkin tree for a second order RM(8, 2) encoder, and FIG. 3B is a schematic drawing that illustrates a Plotkin tree for a non-limiting example embodiment of a KO(8, 2) encoder according to various aspects of the present disclosure. In both figures, boxes with a dashed border are leaves of the tree. Both codes have dimension k=37 and blocklength n=256.

The KO(8, 2) encoder (FIG. 3B) inherits the same Plotkin tree structure as that of the second order RM(8, 2) code (FIG. 3A), and thus RM codes of first order and the second order RM(2, 2) code constitute the leaves of this tree. On the other hand, a distinguishing component of the KO(8, 2) encoder is a set of encoding neural networks $g_\theta\{g_1, \ldots, g_6\}$ that strictly generalize the Plotkin mapping. In other words, we associate a neural network $g_i \in g_\theta$ to each internal node i of this tree. If v and u denote the codewords arriving from left and right branches at this node, we combine them non-linearly via the operation (u, v) $\mapsto g_i$(u, v).

We carefully parametrize each encoding neural network $g_i$ so that they generalize the classical Plotkin map Plotkin(u, v)=(u, u⊕v). In particular, we represent them as $g_i$(u, v)=(u, $\tilde{g}_i$(u, v)+u⊕v), where $\tilde{g}_i: \mathbb{R}^2 \to \mathbb{R}$ is a neural network of input dimension 2 and output size 1. Here $\tilde{g}_i$ is applied coordinate-wise on its inputs u and v. This clever parametrization can also be viewed as a skip connection on top of the Plotkin map. Using these skip-like ideas for both encoders and decoders further contributes to the significant gains over RM codes.

From an encoding perspective, recall that the KO(8, 2) code has code dimension k=37 and block length n=256.

Suppose we wish to transmit a set of 37 message bits denoted as $m=(m_{(2,2)}, m_{(2,1)}, \ldots, m_{(7,1)})$ through our KO(8, 2) encoder. We first encode the block of four message bits $m_{(2,2)}$ into a RM(2, 2) codeword c(2,2) using its corresponding encoder at the bottom most leaf of the Plotkin tree. Similarly we encode the next three message bits $m_{(2,1)}$ into an RM(2, 1) codeword c(2,1). We combine these codewords using the neural network $g_6$ at their parent node, which yields the codeword $c(3, 2)=g_6 (c_{(2,2)}, c_{(2,1)}) \in \mathbb{R}^8$. The codeword c(3,2) is similarly combined with its corresponding left codeword and this procedure is thus recursively carried out till we reach the top most node of the tree, which outputs the codeword $c_{(8, 2)} \in \mathbb{R}^{256}$. Finally we obtain the unit-norm KO(8, 2) codeword x by normalizing $c_{(8,2)}$, i.e., $x=c_{(8,2)}/\|c_{(8,2)}\|_2$.

Note that the map of encoding the message bits m into the codeword x, i.e., $x=g_\theta(m)$, is differentiable with respect to $\theta$ since all the underlying operations at each node of the Plotkin tree are differentiable.

Figure 4A:
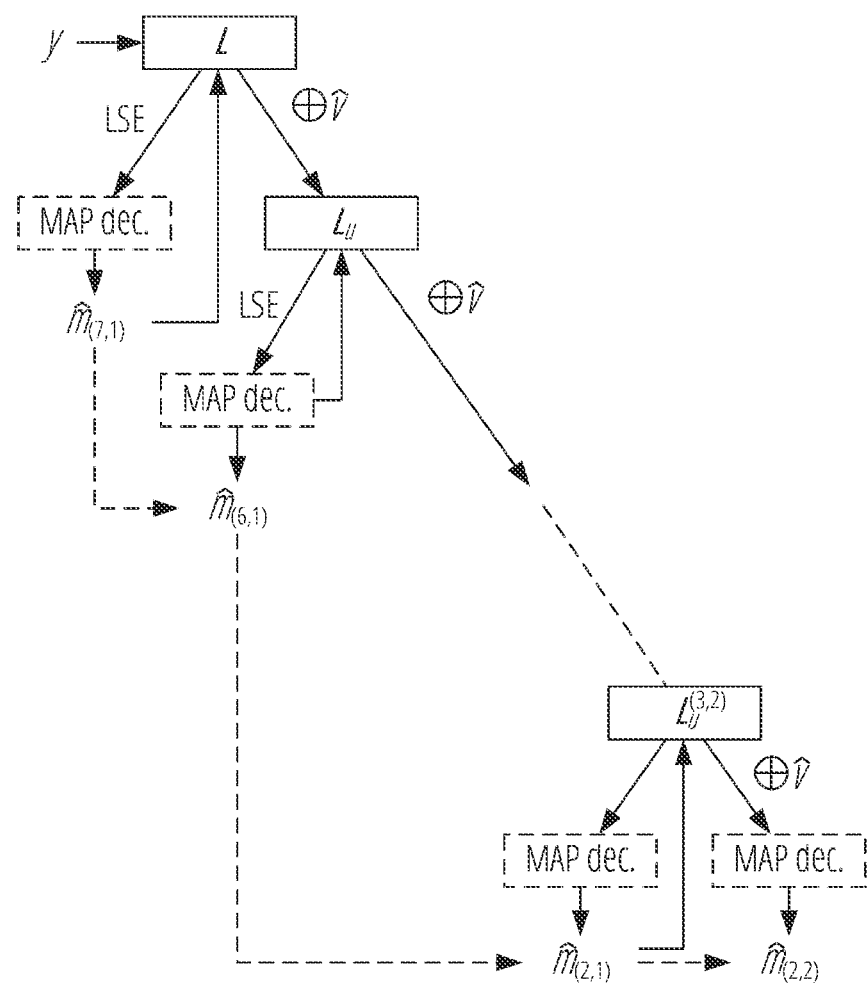
FIG. 4A is a schematic drawing that illustrates a Plotkin tree for an RM (8, 2) decoder.
Figure 4B:
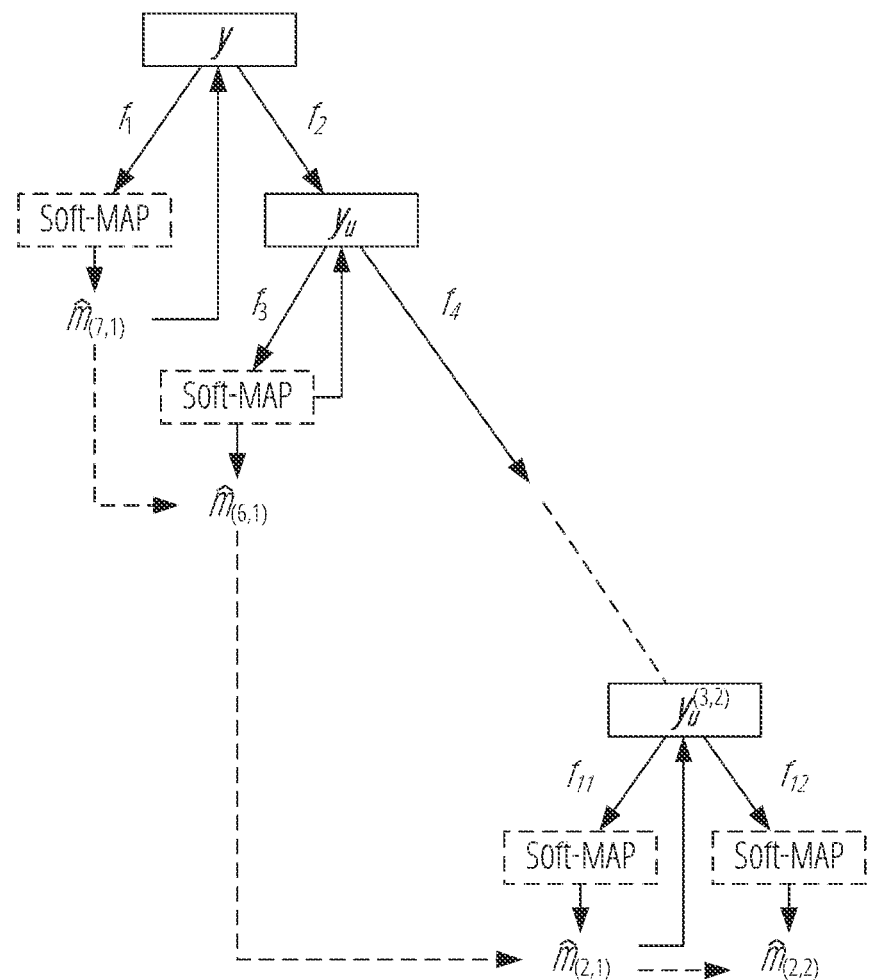
FIG. 4B is a schematic drawing that illustrates a Plotkin tree for a non-limiting example embodiment of a KO (8, 2) decoder according to various aspects of the present disclosure.

FIG. 4A is a schematic drawing that illustrates a Plotkin tree for an RM(8, 2) decoder, and FIG. 4B is a schematic drawing that illustrates a Plotkin tree for a non-limiting example embodiment of a KO(8, 2) decoder according to various aspects of the present disclosure.

Capitalizing on the recursive structure of the encoder, the KO(8, 2) decoder decodes the message bits from top to bottom, similar in style to Dumer's decoding discussed above. More specifically, at any internal node of the tree we first decode the message bits along its left branch, which we utilize to decode that of the right branch and this procedure is carried out recursively till all the bits are recovered. At the leaves, we use the Soft-MAP decoder to decode the bits.

Similar to the encoder $g_\theta$, an important aspect of the KO(8, 2) decoder is a set of decoding neural networks $f_\phi = \{f_1, f_2, \ldots, f_{11}, f_{12}\}$. For each node i in the tree, $f_{2i-1}: \mathbb{R}^2 \to \mathbb{R}$ corresponds to its left branch whereas $f_{2i}: \mathbb{R}^4 \to \mathbb{R}$ corresponds to the right branch. The pair of decoding neural networks $(f_{2i-1}, f_{2i})$ can be viewed as matching decoders for the corresponding encoding network $g_i$: While $g_i$ encodes the left and right codewords arriving at this node, the outputs of $f_{2i-1}$ and $f_{2i}$ represent appropriate Euclidean feature vectors for decoding them. Further, $f_{2i-1}$ and $f_{2i}$ can also be viewed as a generalization of Dumer's decoding to nonlinear real codewords: $f_{2i-1}$ generalizes the LSE function, while $f_{2i}$ extends the operation $\oplus_\beta$. More precisely, represent $f_{2i-1}(y_1, y_2) = \tilde{f}_{2i-1}(y_1, y_2) + \text{LSE}(y_1, y_2)$ whereas $f_{2i}(y_1, y_2, y_v, \hat{v}) = \tilde{f}_{2i}(y_1, y_2, y_v, \hat{v}) + y_1 + (-1)^{\hat{v}} y_2$, where $(y_1, y_2)$ are appropriate feature vectors from the parent node, and $y_v$ is the feature corresponding to the left-child v, and u is the decoded left-child codeword. We explain about these feature vectors in more detail below. Note that both the functions $\tilde{f}_{2i-1}$ and $\tilde{f}_{2i}$ are also applied coordinate-wise.

At the decoder, suppose we receive a noisy codeword $y \in \mathbb{R}^{256}$ at the root upon transmission of the actual codeword $x \in \mathbb{R}^{256}$ along the channel. The first step is to obtain the LLR feature for the left RM(7, 1) codeword: we obtain this via the left neural networkfi, i.e., $y_v = f_1(y_{1:128}, y_{129:256}) \in \mathbb{R}^{128}$. Subsequently, the Soft-MAP decoder transforms this feature into an LLR vector for the message bits, i.e., $L(7, 1) = \text{Soft-MAP}(f_1(y_{1:128}, y_{129:256}))$. Note that the message bits $m_{(7, 1)}$ can be hard decoded directly from the sign of L(7, 1). Instead here we use their soft version via the sigmoid function $\sigma(\cdot)$, i.e., $\hat{m}_{(7,1)} = \sigma(L_{(7, 1)})$. Thus we obtain the corresponding RM(7, 1) codeword $\hat{v}$ by encoding the message $\hat{m}_{(7,1)}$ via an RM(7, 1) encoder.

The next step is to obtain the feature vector for the right child. This is done using the right decoder $f_2$, i.e., $y_u = f_2(y_{1:128}, y_{129:256}, y_v, \hat{v})$. Utilizing this right feature $y_u$ the decoding procedure is thus recursively carried out until we compute the LLRs for all the remaining message bits $m_{(6, 1)}, \ldots, m_{(2, 2)}$ at the leaves. Finally, we obtain the full LLR vector $L = (L_{(7, 1)}, \ldots, L_{(2, 2)})$ corresponding to the message bits m. A simple sigmoid transformation, $\sigma(L)$, further yields the probability of each of these message bits being zero, i.e., $\sigma(L) = \mathbb{P}[m=0]$.

Note that the decoding map $f_\phi: y \mapsto L$ is fully differentiable with respect to $\phi$, which further ensures a differentiable loss for training the parameters $(\theta, \phi)$.

Soft-MAP Decoding

Dumer's decoder for second-order RM codes RM(m, 2) performs MAP decoding at the leaves. In contrast, the KO decoder disclosed herein applies Soft-MAP decoding at the leaves. The leaves of both RM(m, 2) and KO(m, 2) codes are comprised of order-one RM codes and the RM(2, 2) code.

For MAP decoding, given a length-n channel LLR vector $l \in \mathbb{R}^n$ corresponding to the transmission of a given (n, k) node, i.e., code dimension is k and block length is n, with codebook C over a general binary-input memoryless channel, the MAP decoder picks a codeword c* according to the following rule, from (Abbe et al., 2020):

$$c^* = \underset{c \in C}{\text{argmax}} \langle l, 1 - 2c \rangle$$

where $\langle \cdot, \cdot \rangle$ denotes the inner-product of two vectors. Obviously, the MAP decoder needs to search over all $2^k$ codewords while each time computing the inner-product of two length-n vectors. Therefore, the MAP decoder has a complexity of $O(n 2^k)$. Thus the MAP decoder can be easily applied to decode small codebooks like an RM(2, 2) code, that has block length n=4 and a dimension k=4, with complexity O(1). On the other hand, a naïve implementation of the MAP rule for RM(m, 1) codes, that have $2^k = 2^{m+1} = 2n$ codewords, requires $O(n^2)$ complexity. However, utilizing the special structure of order-1 RM codes, one can apply the fast Hadamard transform (FHT) to implement their MAP decoding in a more efficient way, i.e., with complexity O(n log n). The idea behind the FHT implementation is that the standard n×n Hadamard matrix H contains half of the 2n codewords of an RM(m, 1) code (in ±1), and the other half are just —H. Therefore, FHT of the vector l, denoted by $l_{WH}$, lists half of the 2n inner-products in the equation above, and the other half are obtained as $-l_{WH}$. Therefore, the FHT version of the MAP decoder for first-order RM codes can be obtained as:

$$c^* = (1 - \text{sign}(l_{WH}(i^*)) h_{i^*})/2 \text{ s.t. } i^* = \underset{i \in [n]}{\text{argmax}} |l_{WH}(i)|$$

where $l_{WH}(i)$ is the i-th element of the vector $l_{WH}$, and $h_i$ is the i-th row of the matrix H. Given that $l_{WH}$ can be efficiently computed with O(n log n) complexity, this FHT version of the MAP decoder for the first-order RM codes has a complexity of O(n log n).

Note that the MAP decoder and its FHT version involve an argmax(·) operation, which is not differentiable. In order to overcome this issue, we obtain the soft-decision version of the MAP decoder, referred to as Soft-MAP decoder, to come up with differentiable decoding at the leaves. The Soft-MAP decoder obtains the soft LLRs instead of hard decoding of the codes at the leaves. Particularly, consider an AWGN channel model as y=s+n, where y is the length-n vector of the channel output, s:=1-2c, c∈C, and n is the vector of the Gaussian noise with mean zero and variance $\sigma^2$ per element. The LLR of the i-th information bit $u_i$ is then defined as:

$$l_{inf}(i) := \ln\left(\frac{Pr(u_i = 0 \mid y)}{Pr(u_i = 1 \mid y)}\right)$$

By applying the Bayes' rule, the assumption of $Pr(u_i=0)=Pr(u_i=1)$, the law of total probability, and the distribution of the Gaussian noise, we can rewrite this equation as:

$$l_{inf}(i) = \ln\left(\frac{\sum_{s \in C_i^0} \exp(-\|y-s\|_2^2/\sigma^2)}{\sum_{s \in C_i^1} \exp(-\|y-s\|_2^2/\sigma^2)}\right)$$

We can also apply the max-log approximation to approximate this equation as follows:

$$l_{inf}(i) \approx \frac{1}{\sigma^2} \min_{c \in C_i^1} \|y-s\|_2^2 - \frac{1}{\sigma^2} \min_{c \in C_i^0} \|y-s\|_2^2$$

where $C_i^0$ and $C_i^1$ denote the subsets of codewords that have the i-th information bit $u_i$ equal to zero and one, respectively. Finally, given that the length-n LLR vector of the channel output can be obtained as $l:=2y/\sigma^2$ for the AWGN channels, and assuming that all the codeword s's have the same norm, we can obtain a more useful version of the Soft-MAP rule for approximating the LLRs of the information bits as:

$$l_{inf}(i) \approx \max_{c \in C_i^0} \langle l, 1-2c \rangle - \max_{c \in C_i^1} \langle l, 1-2c \rangle$$

It is worth mentioning at the end that, similar to the MAP rule, one can compute all the $2^k$ inner products in $O(n2^k)$ time complexity, and then obtain the soft LLRs by looking at appropriate indices. As a result, the complexity of the Soft-MAP decoding for decoding RM(m, 1) and RM(2, 2) codes is $O(n^2)$ and $O(1)$ respectively. However, one can apply an approach similar to the calculation of c* above to obtain a more efficient version of the Soft-MAP decoder, with complexity $O(n \log n)$, for decoding RM(m, 1) codes.

Neural Network Architecture of KO(8,2)

Figure 5A:
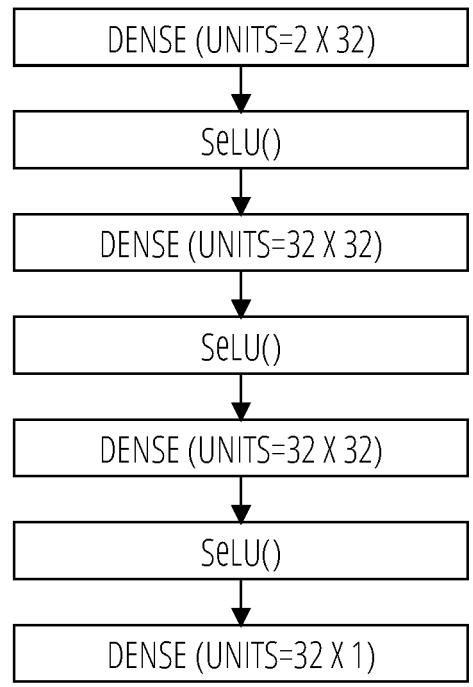
FIG. 5A illustrates a non-limiting example embodiment of a neural network usable in a KO encoder according to various aspects of the present disclosure.

The (encoder, decoder) neural networks may be designed to generalize and build upon the classical pairing of (Plotkin map, Dumer's decoder). In particular, as discussed above the KO encoder $g_\theta$ is parameterized as $g_i(u, v) = (u, \tilde{g}_i(u, v) + u \oplus v)$, where $\tilde{g}: \mathbb{R}^2 \to \mathbb{R}$ is a fully connected neural network. A non-limiting example embodiment of the neural network for $\tilde{g}_i$, is illustrated in FIG. 5A.

Figure 5C:
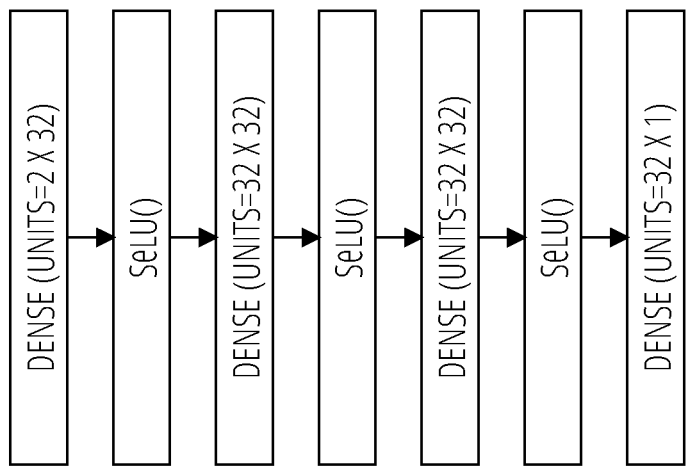
FIG. 5C illustrates a non-limiting example embodiment of a second neural network usable in a KO decoder according to various aspects of the present disclosure.
Figure 5B:
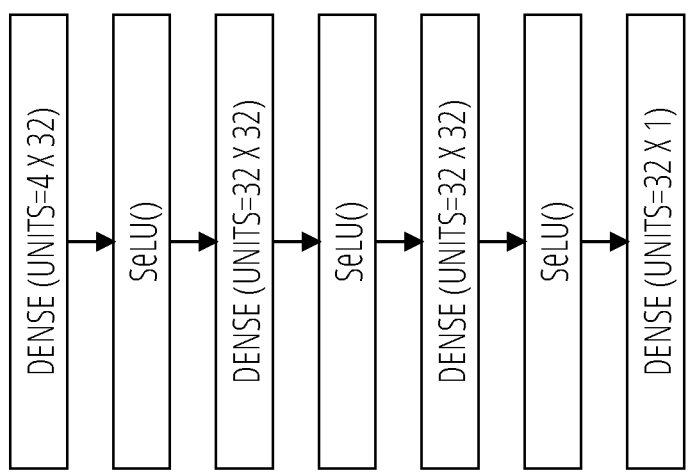
FIG. 5B illustrates a non-limiting example embodiment of a first neural network usable in a KO decoder.

Similarly, the KO decoder may be parametrized as $f_{2i-1}(y_1, y_2) = \tilde{f}_{2i-1}(y_1, y_2) + LSE(y_1, y_2)$ and $f_{2i}(y_1, y_2, y_v, \hat{v}) = \tilde{f}_{2i}(y_1, y_2, y_v, \hat{v}) + y_1 + (-1)^{\hat{v}} y_2$, where $\tilde{f}_{2i-1}: \mathbb{R}^2 \to \mathbb{R}$ and $\tilde{f}_{2i}: \mathbb{R}^4 \to \mathbb{R}$ are also fully connected neural networks. The architecture of $\tilde{f}_{2i}$ is illustrated in FIG. 5B, and the architecture of $\tilde{f}_{2i-1}$ is illustrated in FIG. 5C.

If $\tilde{f} \approx 0$ and $\tilde{g} \approx 0$, we are able to thus recover the standard RM(8, 2) encoder and its corresponding Dumer decoder. By initializing all the weight parameters ($\theta$, $\phi$) sampling from $\mathcal{N}(0, 0.02^2)$, we are able to approximately recover the performance RM(8, 2) at the beginning of training which acts as an appropriate initialization for the training technique described below.

As illustrated, the architecture of the decoder includes a total number of parameters in each decoder neural block that is 69×32. In some embodiments, a simpler decoder may be used by replacing all neural blocks with a smaller neural network with 1 hidden layer of 4 nodes. This decoder neural block has 20 parameters, obtaining a factor of 110 compression in the number of parameters. The computational complexity of this compressed decoder, which we refer to as TinyKO, is within a factor of 4 from Dumer's successive cancellation decoder. Each neural network component has two matrix multiplication steps and one activation function on a vector, which can be fully parallelized on a GPU. With the GPU parallelization, TinyKO has the same time complexity/latency as Dumer's SC decoding. The following table shows that there is almost no loss in reliability for the compressed KO(8, 2) encoder and decoder in this manner. Training a smaller neural network takes about twice as many iterations as the larger one although each iteration is faster for the smaller network.

| SNR (dB) | TinyKO(8, 2) BER | KO(8, 2) BER |
|---|---|---|
| −10 | 0.38414 ± 2e−7 | 0.36555 ± 2e−7 |
| −9 | 0.29671 ± 2e−7 | 0.27428 ± 2e−7 |
| −8 | 0.18037 ± 2e−7 | 0.15890 ± 2e−7 |
| −7 | 0.07455 ± 2e−7 | 0.06167 ± 1e−7 |
| −6 | 0.01797 ± 8e−8 | 0.01349 ± 7e−8 |
| −5 | 2.18083e−3 ± 3e−8 | 1.46003e−3 ± 2e−8 |
| −4 | 1.18919e−4 ± 7e−9 | 0.64702e−4 ± 4e−9 |
| −3 | 4.54054e−6 ± 1e−9 | 3.16216e−6 ± 1e−9 |

Training

Figure 6:
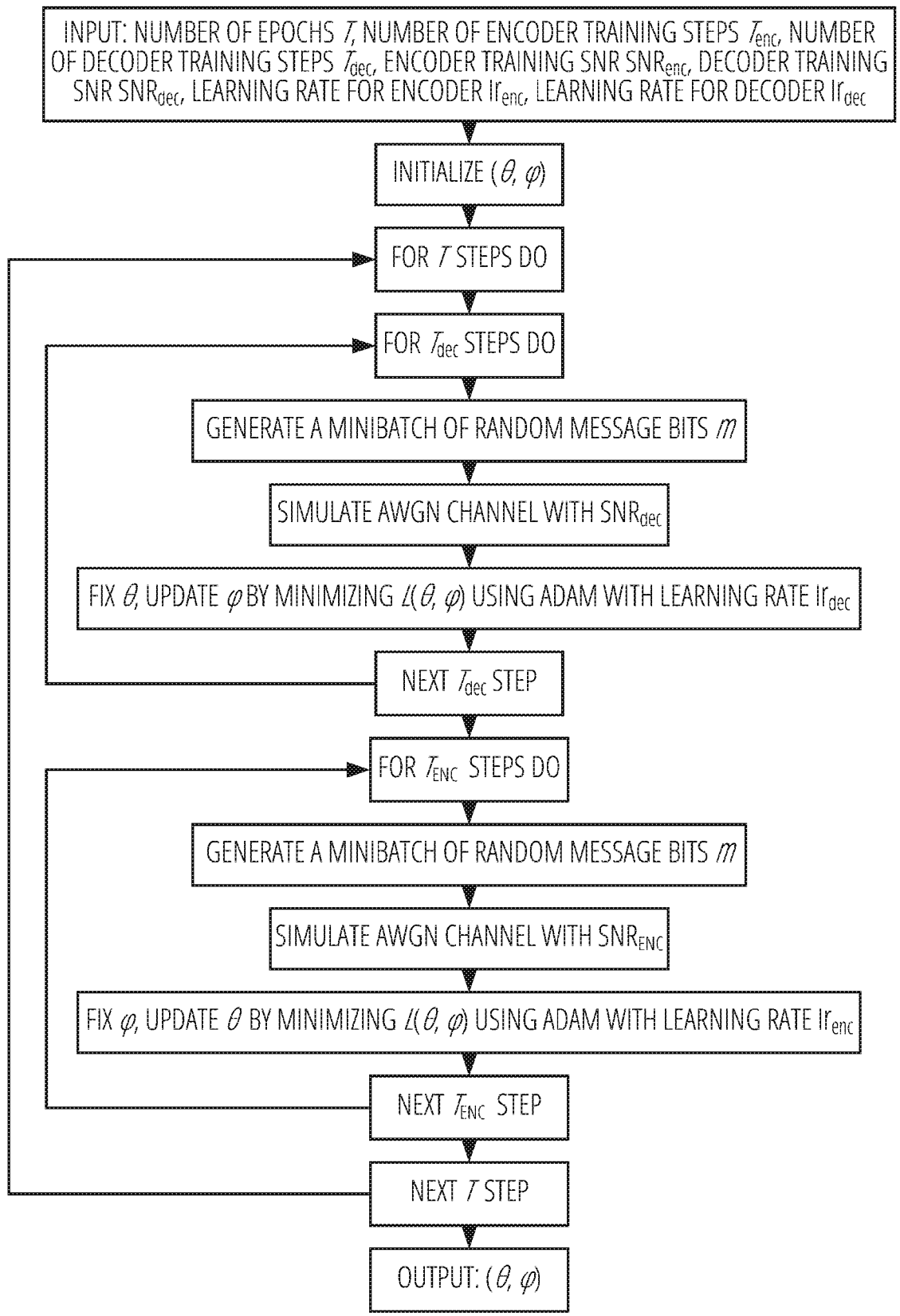
FIG. 6 is a flowchart that illustrates a non-limiting example embodiment of a method of training parameters for the KO (8, 2) encoder and the decoder according to various aspects of the present disclosure.

FIG. 6 is a flowchart that illustrates a non-limiting example embodiment of a method of training parameters for the KO(8, 2) encoder and the decoder according to various aspects of the present disclosure.

Recall that we have the following ow diagram from encoder till the decoder when we transmit the message bits m:

$$m \xrightarrow{g_\theta} x \xrightarrow{Channel} y \xrightarrow{f_\phi} L \xrightarrow{\sigma(\cdot)} \sigma(L).$$

In view of this, we define an end-to-end differentiable cross entropy loss function to train the parameters ($\theta$, $\phi$), i.e.:

$$L(\theta, \phi) = \sum_j m_j \log(1 - \sigma(L_j)) + (1 - m_j) \log \sigma(L_j)$$

The technique illustrated in FIG. 6 is executed on the loss L(O, #) to train the parameters (0, 0) via gradient descent using, e.g., the Adam optimizer. Any suitable values may be used for the constants in the technique illustrated in FIG. 6. As one non-limiting example that was used to generate the experimental results described herein, a batch size of B=50,000, encoder training SNR $SNR_{enc}$=−3 dB, decoder training SNR $SNR_{dec}$=−5 dB, number of epochs T=2000, number of encoder training steps $T_{enc}$=50, and number of decoder training steps $T_{dec}$=500 were used. For the Adam optimizer, a learning rate for the encoder of $lr_{enc}$=$10^{-5}$ and for the decoder of $lr_{dec}$=$10^{-4}$ were used. In other embodiments, other values may be used.

Results of Comparison of KO Codes to RM Codes

In FIG. 1, the trained KO(9, 2) improves over the competing RM(9, 2) both in BER and BLER. The superiority in BLER is unexpected as our training loss is a surrogate for the BER. Though one would prefer to train on BLER as it is more relevant in practice, it is challenging to design a surrogate loss for BLER that is also differentiable: all literature on learning decoders minimize only BER (Kim et al., 2020; Nachmani et al., 2018; Dorner et al., 2017). Consequently, improvements in BLER with trained encoders and/or decoders are rare. Surprisingly, the techniques disclosed herein provide a code that improves both BER and BLER, and we observe a similar gain with KO(8, 2) in FIG. 7.

Figure 7:
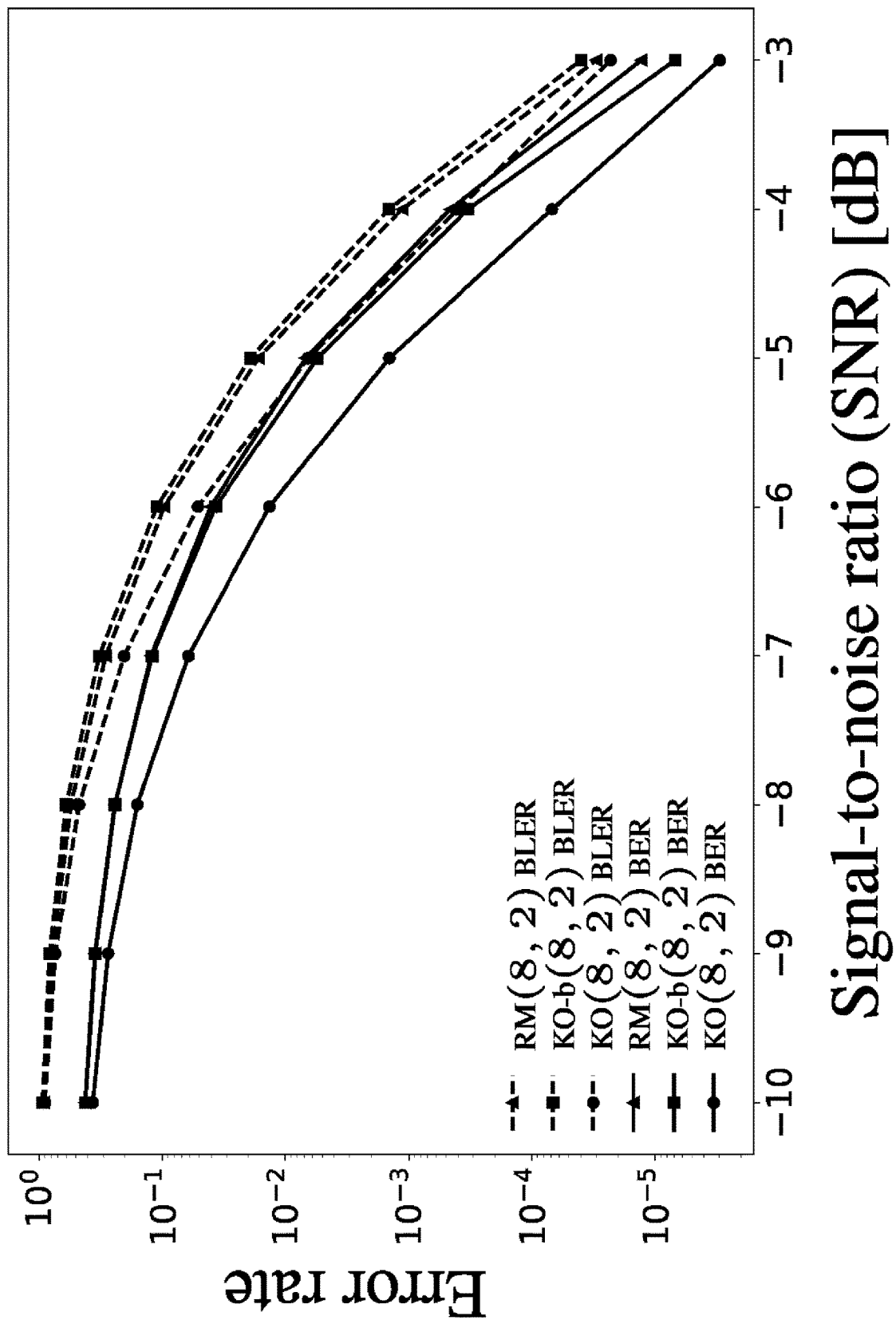
FIG. 7 is a chart that illustrates performance of a non-limiting example embodiment of a trained KO (8, 2) code compared to a RM (8, 2) code and a non-limiting example embodiment of a binarized KO-b (8, 2) code.

Performance of a binarized version KO-b(8, 2) is also shown in FIG. 7. In practice, wireless communication protocols often utilize binary codes. This is mainly because the entire digital communication paradigm is built upon expressing the information in terms of binary bits (Shannon, 1948). Furthermore, system hardware for transceivers uses binary logic gates as the building blocks, making binary encoding and decoding a natural choice. Accordingly, we discretized the output of our KO encoder to output a binary valued codeword $x \in \{\pm 1\}^n$, which we denote by KO-b(8,2). KO-b(8,2) only slightly improves over the RM(8,2), suggesting that searching over the larger space of real-valued codewords is helpful for providing the improved performance described above. Further, for KO-b codes, the Gaussian-like structure of trained codewords is destroyed and pairwise distribution falls back to that of RM codes.

To interpret the learned KO code, we examine the pairwise distance between codewords. In classical linear coding, pairwise distances are expressed in terms of the weight distribution of the code, which counts how many codewords of each specific Hamming weight 1, 2, . . . , n exist in the code. The weight distribution of linear codes are used to derive analytical bounds, that can be explicitly computed, on the BER and BLER over AWGN channels (Sason & Shamai, 2006). For nonlinear codes, however, the weight distribution does not capture pairwise distances. Therefore, we explore the distribution of all the pairwise distances of non-linear KO codes that can play the same role as the weight distribution does for linear codes.

The pairwise distance distribution of the RM codes remains an active area of research as it is used to prove that RM codes achieve the capacity (Kaufman et al., 2012; Abbe et al., 2015; Sberlo & Shpilka, 2020). However, these results are asymptotic in the block length and do not guarantee a good performance, especially in the small-to-medium block lengths that we are interested in. On the other hand, Gaussian codebooks, codebooks randomly picked from the ensemble of all Gaussian codebooks, are known to be asymptotically optimal, i.e., achieving the capacity (Shannon, 1948), and also demonstrate optimal finite-length scaling laws closely related to the pairwise distance distribution (Polyanskiy et al., 2010).

Remarkably, the pairwise distance distribution of KO code shows a staggering resemblance to that of the Gaussian codebook of the same rate p and blocklength n. This is an unexpected phenomenon since we minimize only BER. We posit that the NN training has learned to construct a Gaussian-like codebook, in order to minimize BER. Most importantly, unlike the Gaussian codebook, KO codes constructed via NN training are fully compatible with efficient decoding. This phenomenon is observed for all order-2 codes we trained.

We have also analyzed how the KO decoder contributes to the gains in BLER over the RM encoder. Let m=$(m_{(7, 1)}, \ldots, m_{(2, 2)})$ denote the block of transmitted message bits, where the ordered set of indices $\mathscr{L}$={(7, 1), . . . , (2, 2)} correspond to the leaf branches (RM codes) of the Plotkin tree. Let $\hat{m}$ be the decoded estimate by the KO(8, 2) decoder.

Plotkin trees of RM(8, 2) and KO(8, 2) are provided in FIG. 4A and FIG. 4B, respectively. Recall that for this KO(8, 2) decoder, similar to the KO(3, 1) decoder, we decode each sub-code in the leaves sequentially, starting from the (7, 1) branch down to (2, 2): $\hat{m}_{(7, 1)} \rightarrow \ldots \rightarrow \hat{m}_{(2, 2)}$. In view of this decoding order, BLER<defined as $\mathbb{P}[\hat{m} \neq m]$ can be decomposed as:

$$\mathbb{P}[\hat{m} \neq m] = \sum_{i \in \mathscr{L}} \mathbb{P}[\hat{m}_i \neq m_i, \hat{m}_{1:i-1} = m_{1:i-1}]$$

In other words, BLER can also be represented as the sum of the fraction of errors the decoder makes in each of the leaf branches when no errors were made in the previous ones. Thus, each term in the equation above can be viewed as the contribution of each sub-code to the total BLER. The KO(8, 2) decoder achieves better BLER than the RM(8, 2) decoder by making major gains in the leftmost (7, 1) branch (which is decoded first) at the expense of other branches. However, the decoder (together with the encoder) has learnt to better balance these contributions evenly across all branches, resulting in lower BLER overall. The unequal errors in the branches of the RM code has been observed before, and some efforts made to balance them (Dumer & Shabunov, 2001); that KO codes learn such a balancing scheme purely from data is, perhaps, remarkable.

As the environment changes dynamically in real world channels, robustness is crucial in practice. We therefore test the KO code under canonical channel models and demonstrate robustness, i.e., the ability of a code trained on AWGN to perform well under a different channel without retraining. It is well known that Gaussian noise is the worst case noise among all noise with the same variance (Lapidoth, 1996; Shannon, 1948) when an optimal decoder is used, which might take an exponential time. When decoded with efficient decoders, as we do with both RM and KO codes, catastrophic failures have been reported in the case of Turbo decoders (Kim et al., 2018). We show that both RM codes and KO codes are robust and that KO codes maintain their gains over RM codes as the channels vary.

Figure 8:
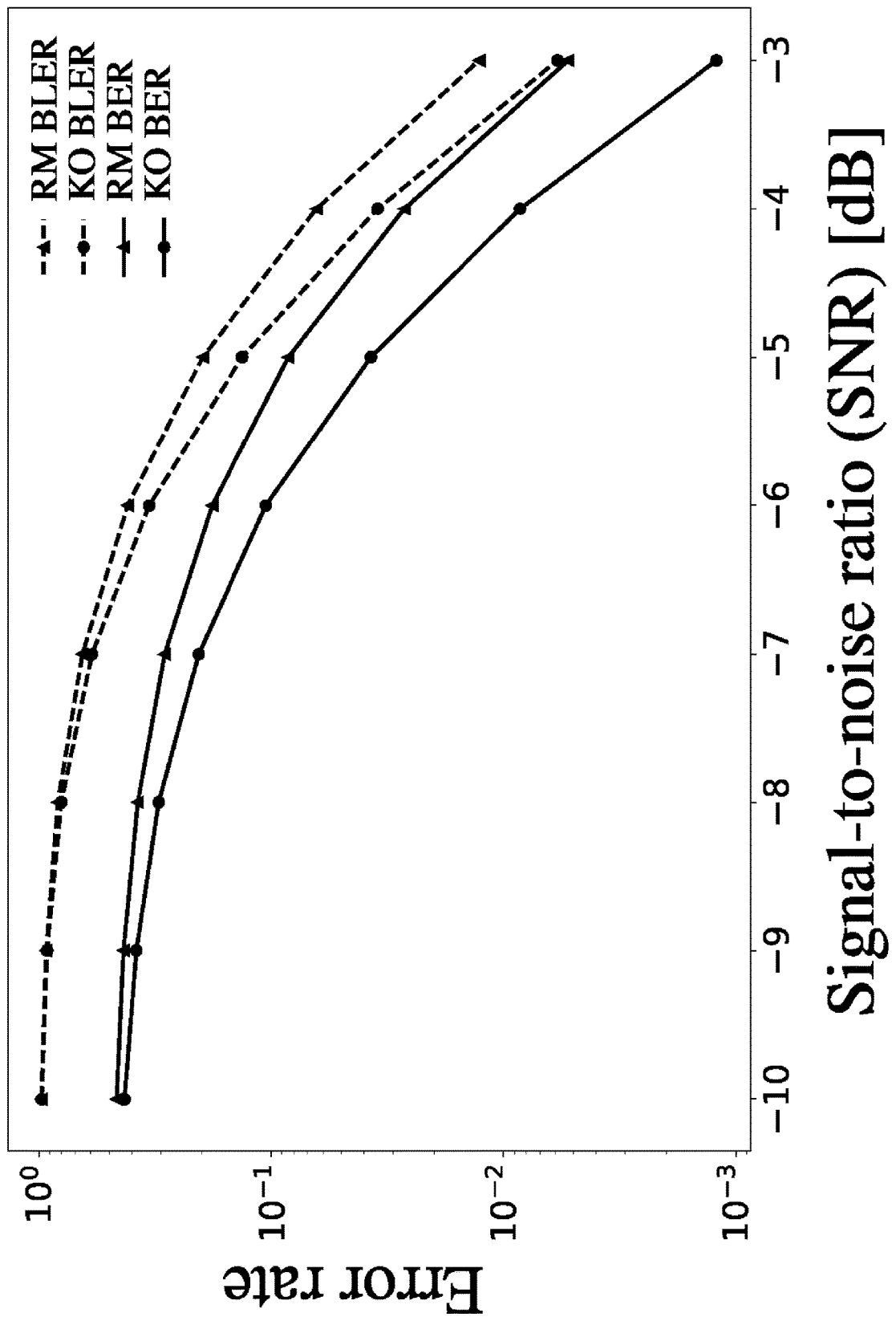
FIG. 8 is a chart that illustrates the result of testing a non-limiting example embodiment of a trained KO (8, 2) code compared to an RM (8, 2) code on a Rayleigh fast fading channel.

FIG. 8 illustrates the results of testing on a Rayleigh fast fading channel, defined as $y_i=a_ix_i+n_i$, where $x_i$ is the transmitted symbol, $y_i$ is the received signal, $n_i \sim \mathcal{N}(0, \sigma^2)$ is the additive Gaussian noise, and a is from a Rayleigh distribution with the variance of a chosen as $\mathbb{E}[a_i^2]=1$. As shown, KO(8,2) maintained a significant gain over RM(8, 2).

Figure 9:
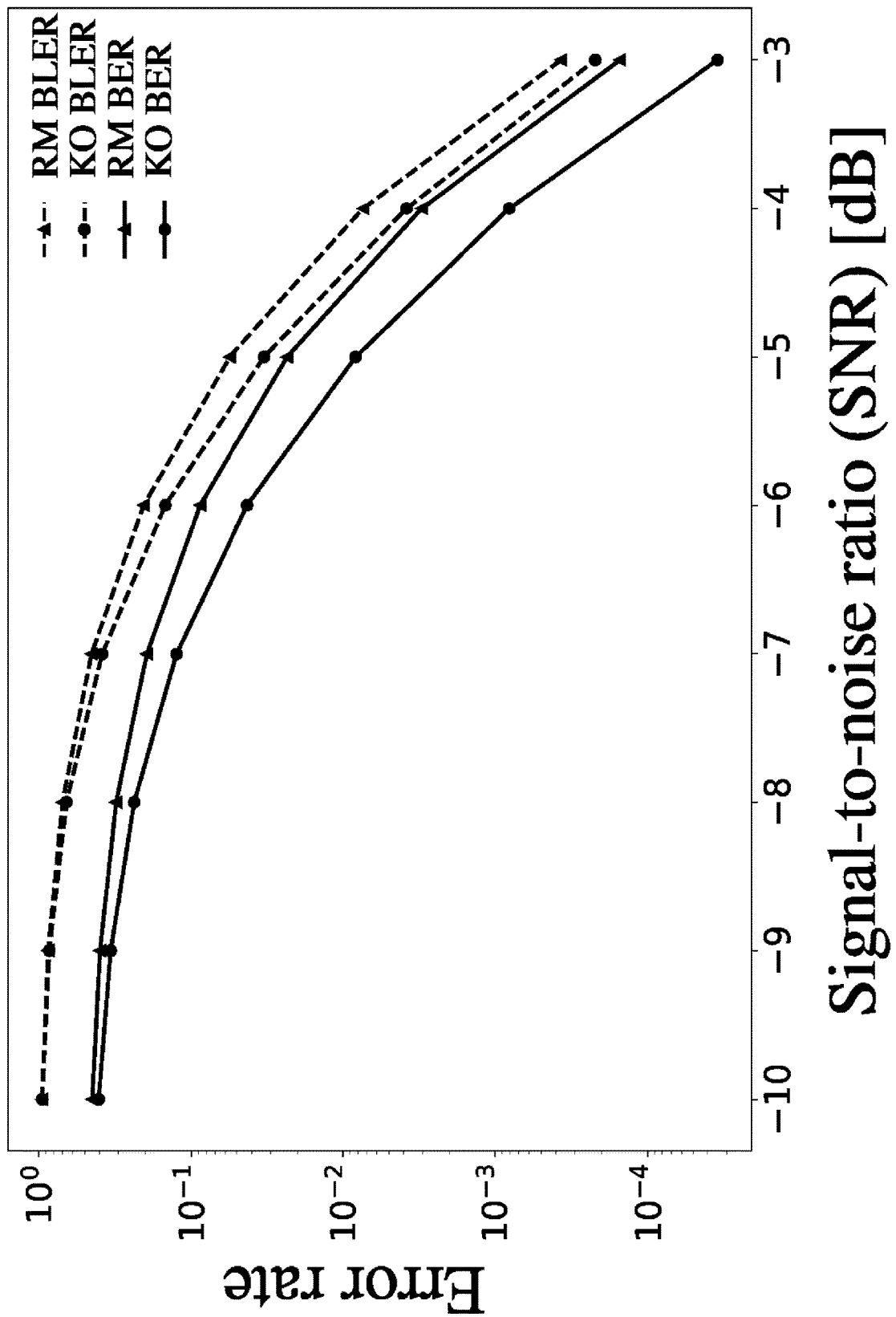
FIG. 9 is a chart that illustrates the result of testing a non-limiting example embodiment of a trained KO (8, 2) code compared to an RM (8, 2) code on a bursty channel.

FIG. 9 illustrates the results of testing on a bursty channel, defined as $y_i=x_i+n_i+w_i$, where $x_i$ is the input symbol, $y_i$ is the received symbol, $n_i \sim \mathcal{N}(0, \sigma^2)$ is the additive Gaussian noise, and $w_i \sim \mathcal{N}(0, \sigma_b^2)$ with probability ρ and $w_i$=0 with probability 1−ρ. In the experiment, we chose ρ=0.1 and $\sigma_b=\sqrt{2}\sigma$. As shown, KO(8, 2) was robust when tested on the bursty channel and maintains a significant gain over RM(8, 2).

Results for Order-1 Codes

Here we focus on first order KO(m, 1) codes, and in particular KO(6, 1) code that has code dimension k=7 and blocklength n=64. The training of the (encoder, decoder) pair $(g_\theta, f_\phi)$ for KO(6, 1) is almost identical to that of the second order RM(8, 2) described above. The only difference is that we now use the Plotkin tree structure of the corresponding RM(6, 1) code. In addition, we also train our neural encoder $g_\theta$ together with the differentiable MAP decoder, i.e. the Soft-MAP, to compare its performance to that of the RM codes.

Figure 10A:
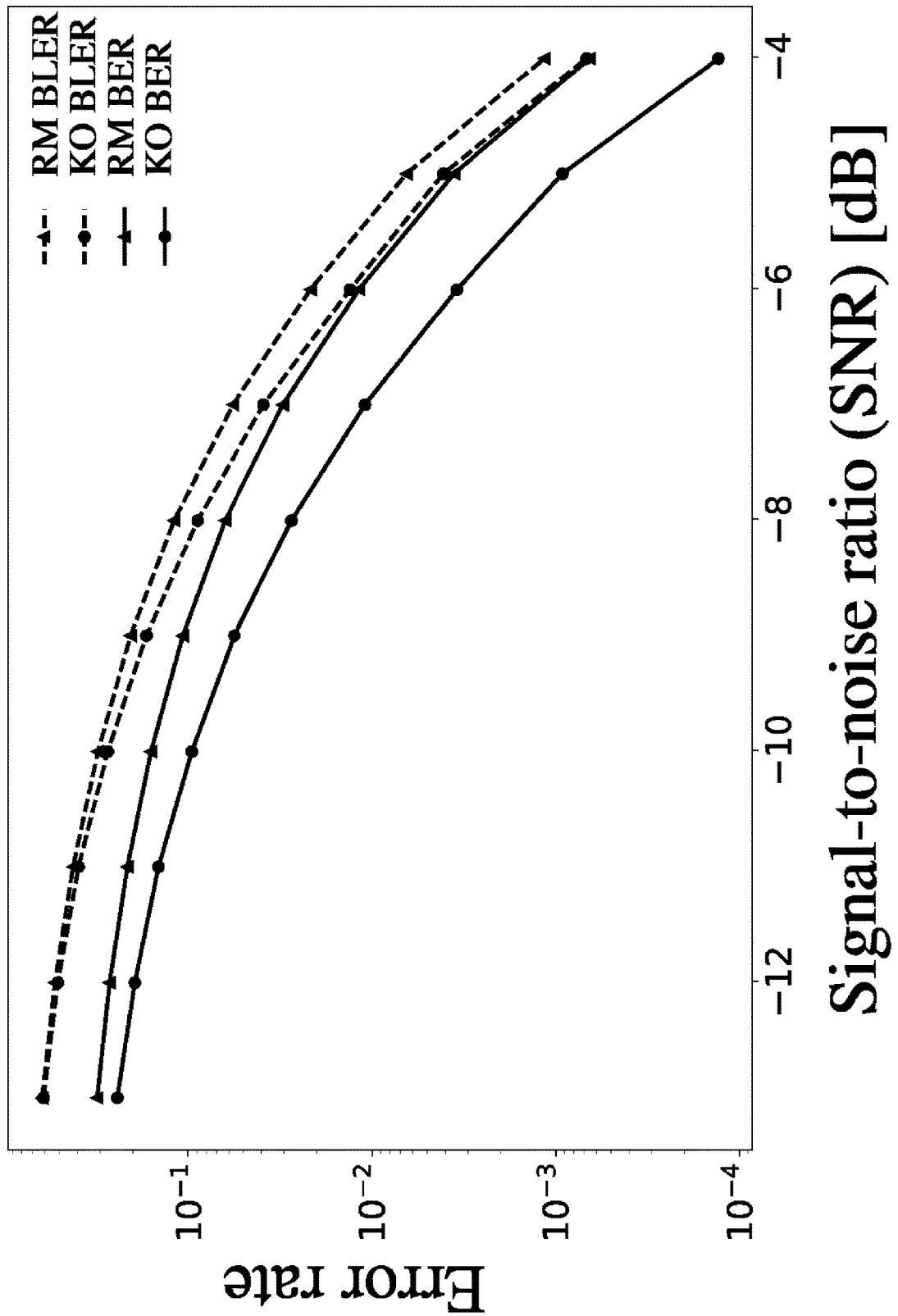
FIG. 10A and FIG. 10B illustrates the result of testing a non-limiting example embodiment of a first order KO (m, 1) code versus an RM (8, 2) code.
Figure 10B:
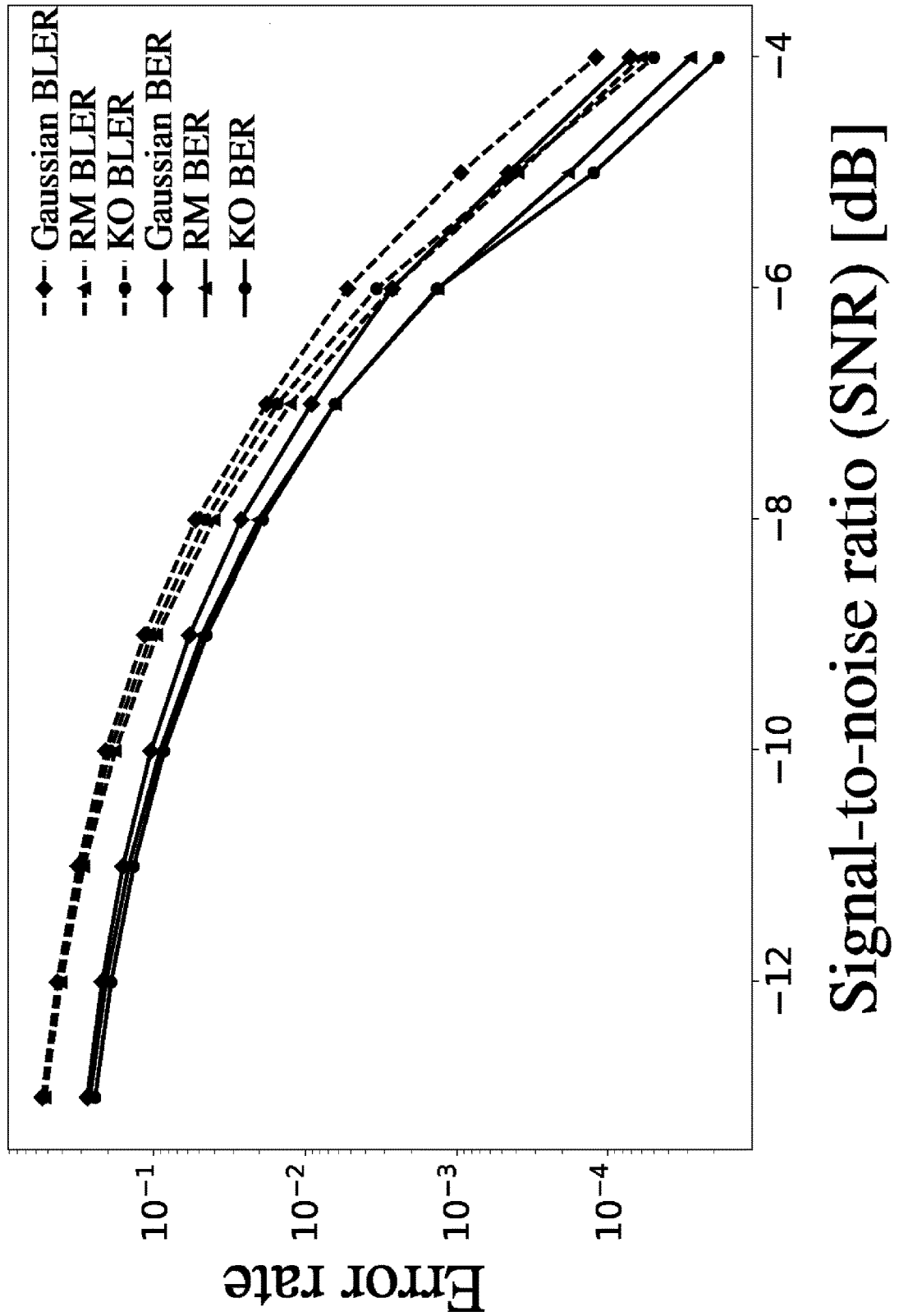

FIG. 10A and FIG. 10B illustrate these results. FIG. 10A highlights that KO(6, 1) obtains significant gain over RM(6, 1) code (with Dumer decoder) when both the neural encoder and decoder are trained jointly. On the other hand, in FIG. 10B, we notice that we match the performance of that of the RM(6, 1) code (with the MAP decoder) when we just train the encoder $g_\theta$ (with the MAP decoder). In other words, under the optimal MAP decoding, KO(6, 1) and RM(6, 1) codes behave the same. Note that the only caveat for KO(6, 1) in the second setting is that its MAP decoding complexity is $O(n^2)$ while that of the RM is $O(n \log n)$.

Polar Codes

Polar and RM codes are closely related, especially from an encoding point of view. The generator matrices of both codes are chosen from the same parent square matrix by following different row selection rules. More precisely, consider an RM(m, r) code that has code dimension $$k = \sum_{i=0}^{r} \binom{m}{i}$$

and blocklength $n=2^m$. Its encoding generator matrix is obtained by picking the k rows of the square matrix $$G_{n \times n} := \begin{bmatrix} 0 & 1 \\ 1 & 1 \end{bmatrix}^{\otimes m}$$

that have the largest Hamming weights (i.e., Hamming weight of at least $2^{m-r}$), where $[\cdot]^{\otimes m}$ denotes the m-th Kronecker power. The Polar encoder, on the other hand, picks the rows of $G_{n \times n}$ that correspond to the most reliable bit-channels (Arikan, 2009).

The recursive Kronecker structure inherent to the parent matrix $G_{n \times n}$ can also be represented by a computation graph: a complete binary tree. Thus the corresponding computation tree for a Polar code is obtained by freezing a set of leaves (row-selection). We refer to this encoding computation graph of a Polar code as its Plotkin tree. This Plotkin tree structure of Polar codes enables a matching efficient decoder: the successive cancellation (SC). The SC decoding algorithm is similar to Dumer's decoding for RM codes. Hence, Polar codes can be completely characterized by their corresponding Plotkin trees. Successive cancellation decoding can be significantly improved further by list decoding. List decoding allows one to gracefully tradeoff computational complexity and reliability by maintaining a list (of a fixed size) of candidate codewords during the decoding process. The KO(8, 2) code with list decoding enjoys a significant gain over the non-list counterpart.

Inspired by the Kronecker structure of Polar Plotkin trees, we design a new family of KO codes to strictly improve upon them. We build a novel NN architecture that capitalizes on the Plotkin tree skeleton and generalizes it to nonlinear codes. This enables us to discover new nonlinear algebraic structures.

As described above, the Plotkin tree for a Polar code is obtained by freezing a set of leaves in a complete binary tree. These frozen leaves are chosen according to the reliabilities, or equivalently, error probabilities, of their corresponding bit channels. In other words, we first approximate the error probabilities of all the n-bit channels and pick the k-smallest of them using the procedure described in (Tal & Vardy, 2013). These k active set of leaves correspond to the transmitted message bits, whereas the remaining n−k frozen leaves always transmit zero.

Figure 11A:
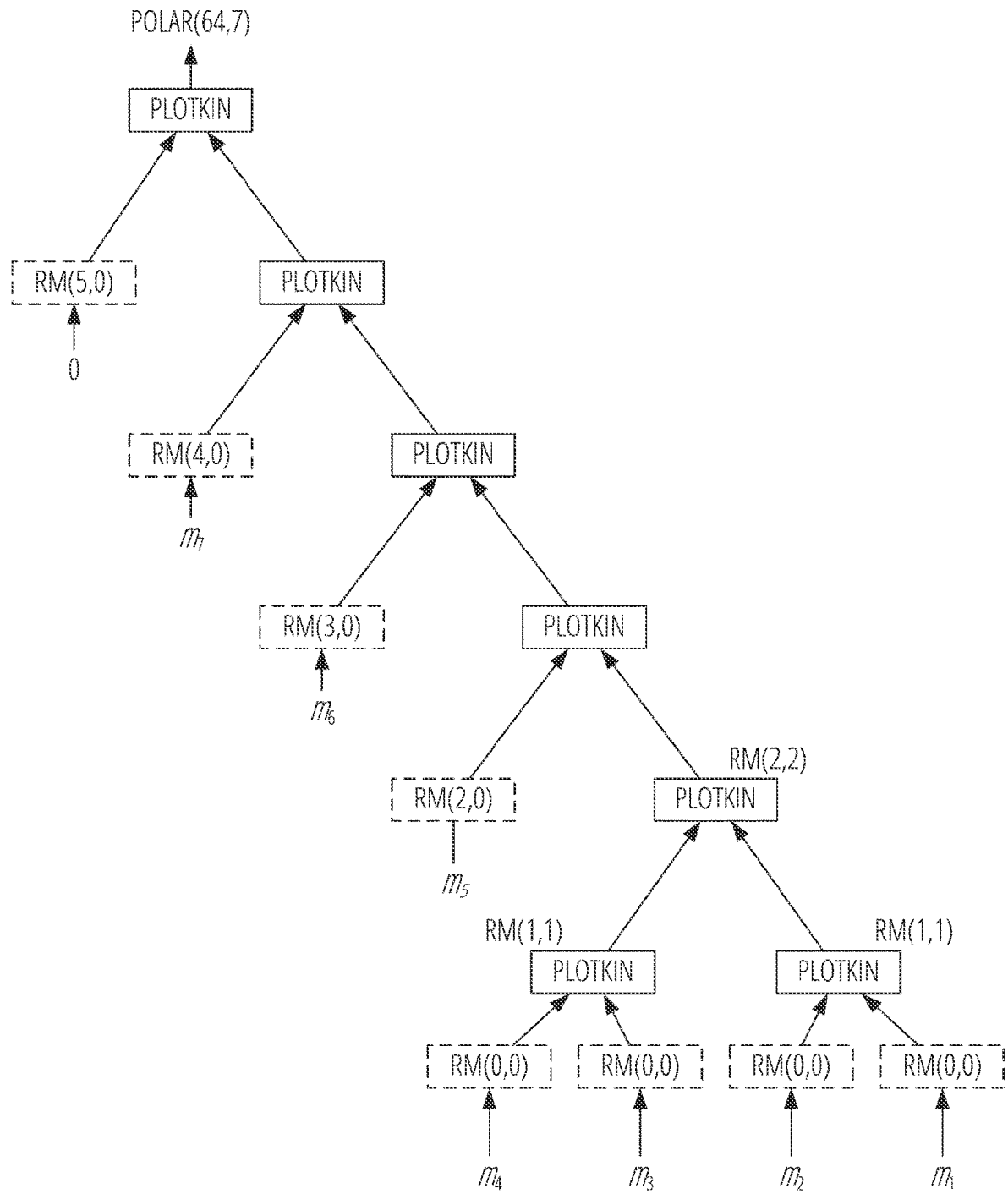
FIG. 11A is a Plotkin tree that illustrates a Polar (64, 7) code.

In the present description, we focus on a specific Polar code: Polar(64, 7), with code dimension k=7 and block-length n=64. For Polar (64, 7), we obtain these active set of leaves to be $\mathscr{A}=\{48, 56, 60, 61, 62, 63, 64\}$, and the frozen set to be $\mathscr{A}^C=\{1, 2, \ldots, 64\}\backslash\mathscr{A}$. Using these set of indices and simplifying the redundant branches, we obtain the Plotkin tree for Polar (64, 7) as illustrated in FIG. 11A. We observe that this Polar Plotkin tree shares some similarities with that of a RM(6, 1) code (with same k=7 and n=64) with key differences at the top-most and bottom-most leaves.

Figure 11B:
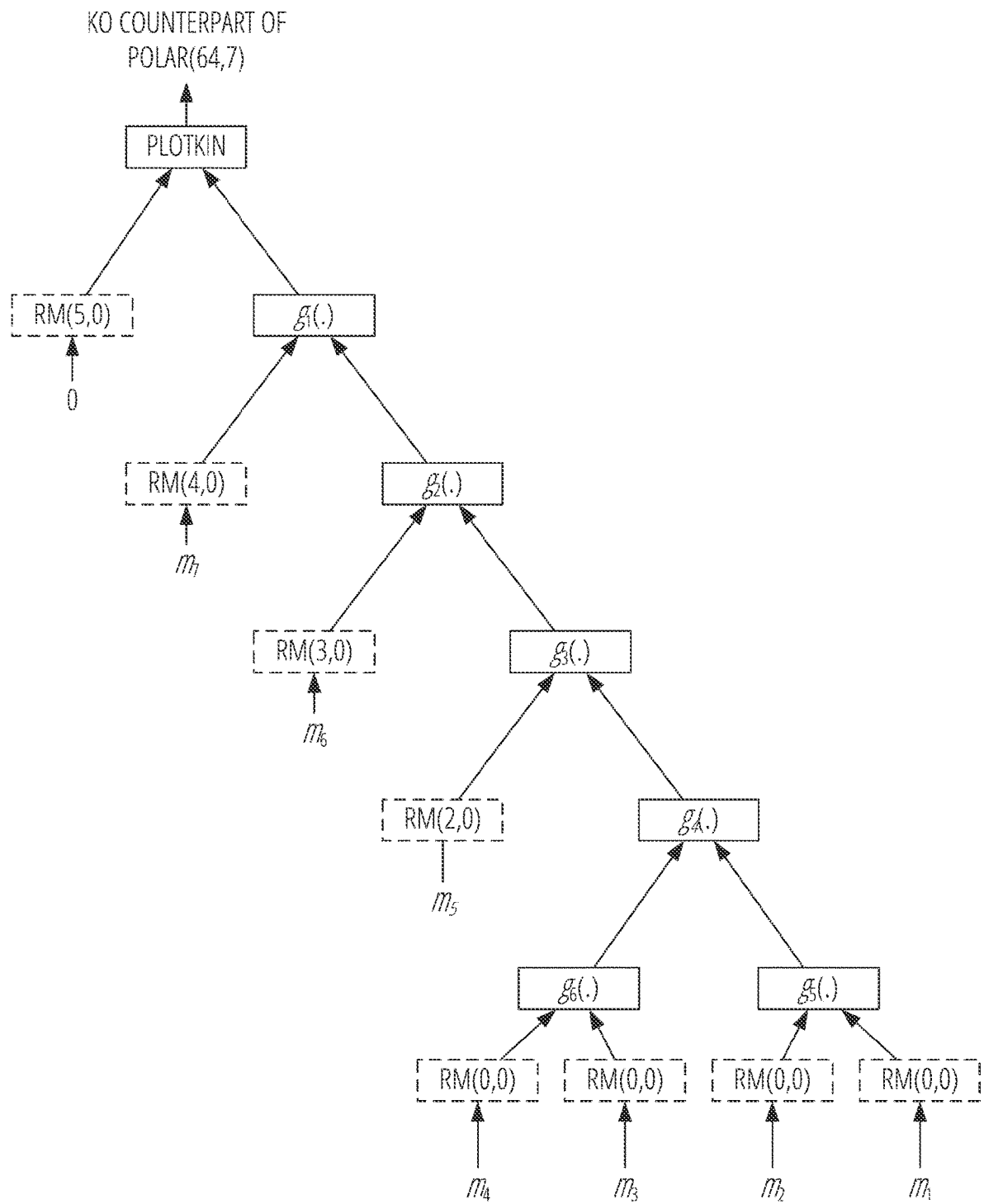
FIG. 11B is a Plotkin tree that illustrates a non-limiting example embodiment of a KO encoder based on the Polar (64, 7) code according to various aspects of the present disclosure.

Capitalizing on the encoding tree structure of Polar(64, 7), we build a corresponding KO encoder $g_\theta$ which inherits this tree skeleton. In other words, we generalize the Plotkin mapping blocks at the internal nodes of the tree, except for the root node, and replace them with a corresponding neural network $g_i$. FIG. 11B illustrates the Plotkin tree of this KO encoder. The KO decoder $f_\phi$ is designed similarly.

The KO encoder and decoder can be trained in an end-to-end manner using variants of stochastic gradient descent as illustrated in FIG. 6.

Figure 12:
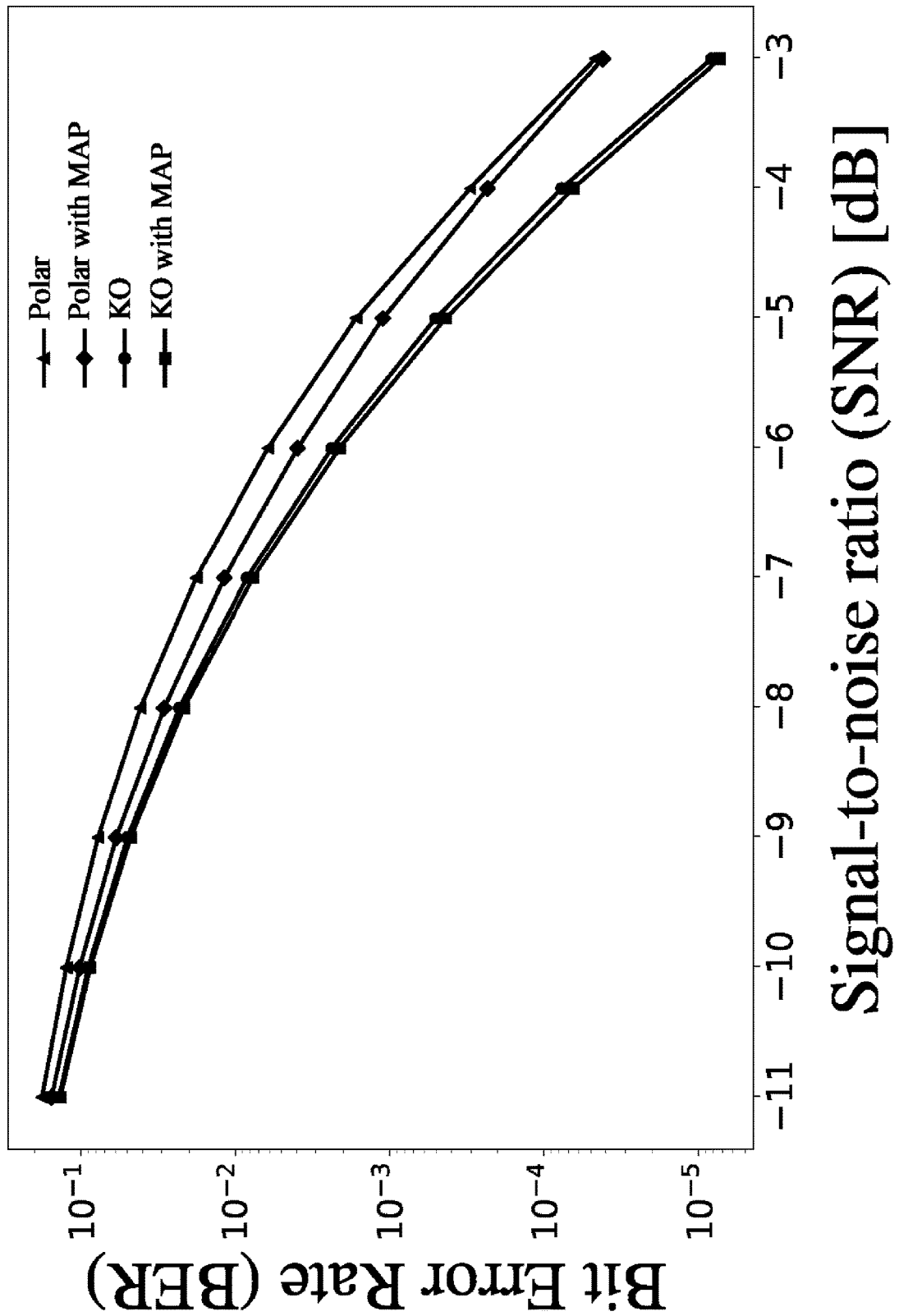
FIG. 12 is a chart that compares the performance of a non-limiting example embodiment of the KO code to the Polar (64, 7) code.

In FIG. 12, we compare the performance of our KO code with its competing Polar(64, 7) code, i.e., code dimension k=7 and block length n=64, in terms of BER. FIG. 12 highlights that our KO code achieves significant gains over Polar(64, 7) on a wide range of SNRs. In particular, we obtain a gain of almost 0.7 dB compared to that of Polar at the BER $10^{-4}$. For comparison we also plot the performance of both codes with the optimal MAP decoding. We observe that the BER curve of our KO decoder, unlike the SC decoder, almost matches that of the MAP decoder, convincingly demonstrating its optimality.

Figure 13:
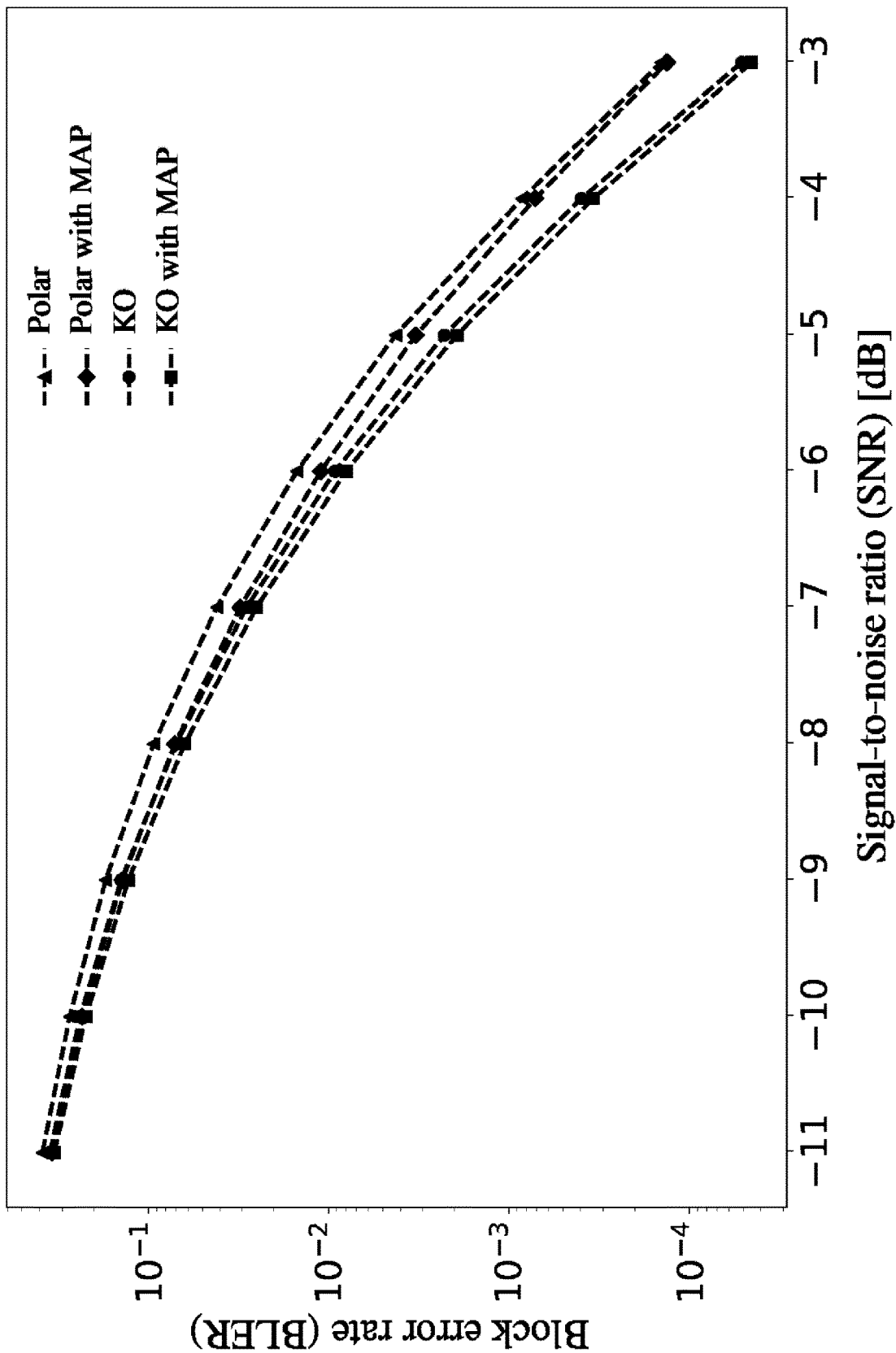
FIG. 13 is a chart that illustrates the BLER performance of the Polar (64, 7) code and a non-limiting example embodiment of the KO code, for the AWGN channel.

FIG. 13 is a chart that illustrates the BLER performance of the Polar(64, 7) code and its corresponding KO code, for the AWGN channel. Similar to the BER performance illustrated in FIG. 12, the KO code is able to significantly improve the BLER performance. For example, a gain of around 0.5 dB is achieved when the KO encoder is combined with the MAP decoding. Additionally, the close performance of the KO decoder to that of the MAP decoder confirms its optimality. This successful case study with training KO (encoder, decoder) pairs further demonstrates that the novel neural architectures disclosed herein seamlessly generalize to codes with an underlying Kronecker product structure.

Additional Description

Figure 14B:
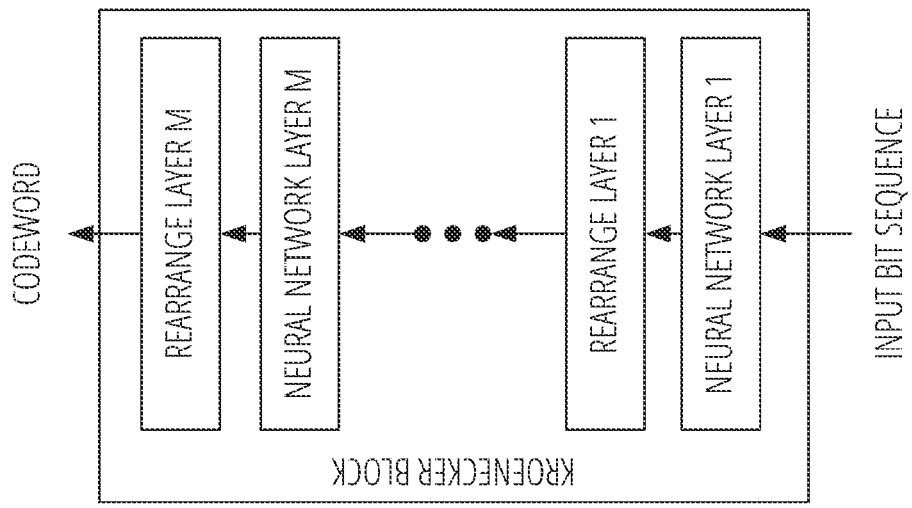
FIG. 14B is a block diagram of a non-limiting example embodiment of the Kronecker block that includes an input for an input bit sequence and an output for outputting a codeword, according to various aspects of the present disclosure.
Figure 14A:
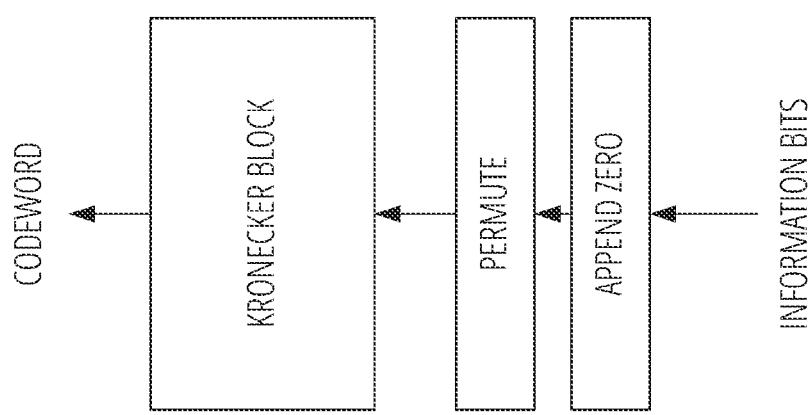
FIG. 14A is a schematic illustration of a non-limiting example embodiment of actions performed by a computing apparatus for encoding a bit sequence to a codeword, according to various aspects of the present disclosure.
Figure 14C:
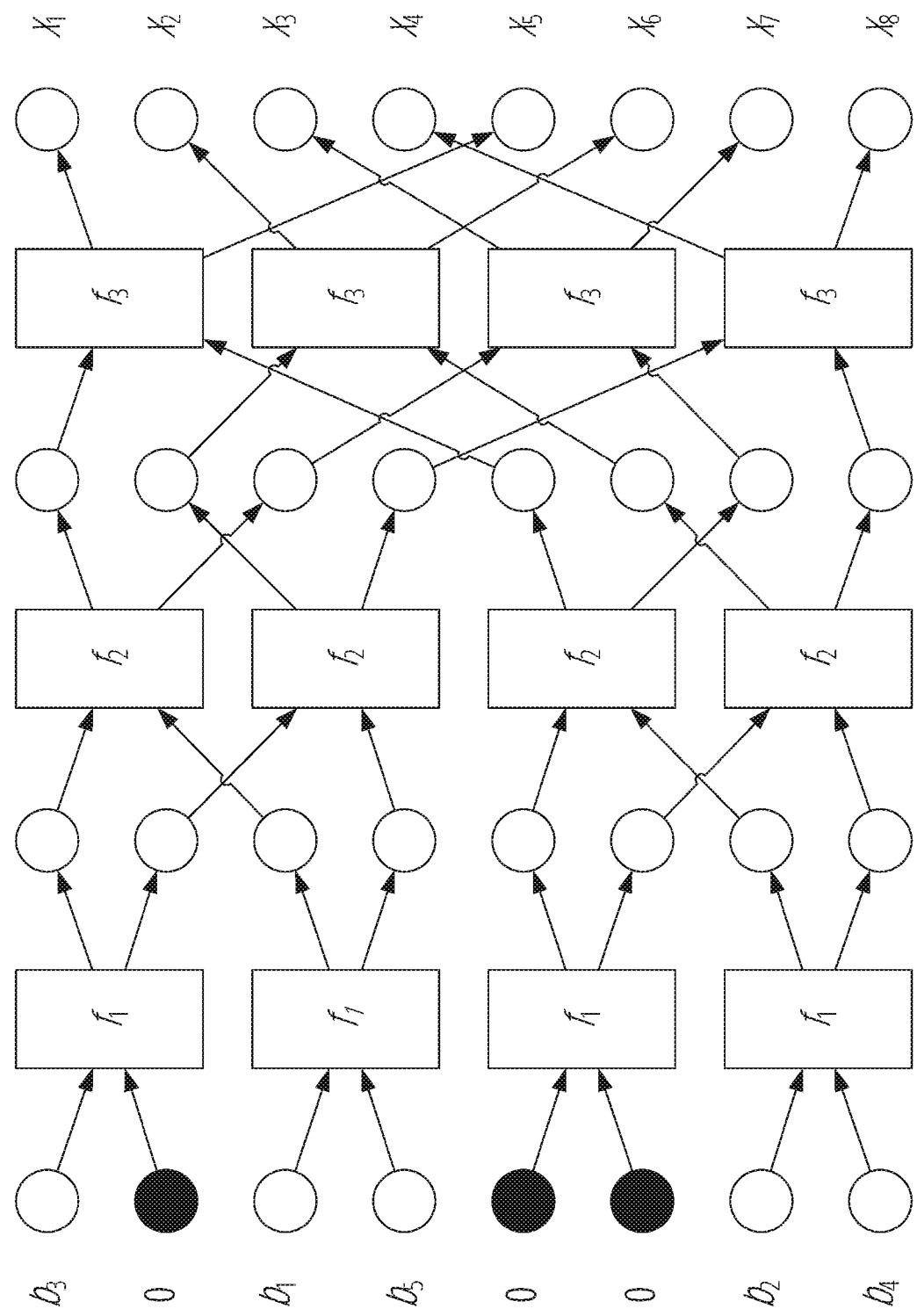
FIG. 14C is a schematic diagram that illustrates a non-limiting example embodiment of a Kronecker block according to various aspects of the present disclosure.

FIG. 14A-FIG. 14C illustrate aspects of a non-limiting example embodiment of an encoder capable of encoding KO codes as described above, according to various aspects of the present disclosure.

FIG. 14A is a schematic illustration of actions performed by a computing apparatus for encoding a bit sequence to a codeword, according to various aspects of the present disclosure. The actions include a zero-appending block, a permutation block, and a Kronecker block.

The zero-append block includes an input for a sequence of bits and an output for outputting a bit sequence. In an embodiment, the code may include codeword blocklength n, code rate r, and information blocklength k. Information bit sequence is a binary sequence of length k. Zero-append block appends n−k zeros to the information bit sequence to output a bit sequence of length n. The codeword blocklength may be 8 and information bit length may be 5. Append zero may append 3 bits of zero value to the length 5 information bits.

The permutation block includes an input for a sequence of bits and an output for outputting a bit sequence. In an embodiment, a permutation $\pi$ for an n dimensional binary vector is chosen and applied to the input bit sequence of length n to output a permuted bit sequence of length n. A permutation block of length 8 may be take as input $b=[b_1, b_2, b_3, b_4, b_5, 0, 0, 0]$ with length 5 information bits and three appended zeros, and output $\tilde{b}=[b_3, 0, b_1, b_5, 0, 0, b_2, b_4]$. In some embodiments, different numbers of bits, blocklengths, or code rates may be used, as may different permutations.

FIG. 14B is a block diagram of the Kronecker block that includes an input for an input bit sequence and an output for outputting a codeword. In some embodiments, the input bit sequence comprises information bits in their permuted positions according to the permutation block. The rest of the input bit sequence are called frozen and have value of zero. The Kronecker block includes a sequence of alternating neural network blocks and rearrange blocks. A neural network layer takes input of a real valued vector and outputs a non-linear function of the input as a real valued vector. A rearrange layer takes input of a real values vector and outputs a rearrangement of the input vector as an output vector. In an embodiment, neural network layer 1 may be 3 layer fully connected neural networks with ReLU activation, an input size of 8, hidden layers with a width of 30, and an output layer of size 8. In an embodiment, rearrange layer 1 might take a 8 dimensional input $b=[b_1, b_2, b_3, b_4, b_5, b_6, b_7, b_8]$ and output $\tilde{b}=[b_1, b_3, b_2, b_4, b_5, b_7, b_6, b_8]$. The same neural networks layers and rearrange layers may be repeated for m=5 layers. In some embodiments, different permutations, different sizes of layers, different numbers of layers, different activation functions, and different sizes of inputs and/or outputs may be used.

FIG. 14C is a schematic diagram that illustrates a non-limiting example embodiment of a Kronecker block according to various aspects of the present disclosure. In some embodiments, the Kronecker block may take as input a binary sequence $\tilde{b}=[\tilde{b}_1, \tilde{b}_2, \tilde{b}_3, \tilde{b}_4, \tilde{b}_5, \tilde{b}_6, \tilde{b}_7, \tilde{b}_8]=[b_3, 0, b_1, b_5, 0, 0, b_2, b_4]$ where $[b_1, b_2, b_3, b_4, b_5]$ are information bits of length 5 and the zeros are frozen bits. A neural network layer 1 may be 4 parallel neural networks sharing the same weights denoted by $f_1$, taking $\tilde{b}$ as input, and outputting $h_1=[h_{11}, h_{12}, h_{13}, h_{14}, h_{15}, h_{16}, h_{17}, h_{18}]$. The mapping may be $(h_{11}, h_{12})=f_1(\tilde{b}_1, \tilde{b}_2))$, $(h_{13}, h_{14})=f_1(\tilde{b}_3, \tilde{b}_4))$, $(h_{15}, h_{16})=f_1(\tilde{b}_5, \tilde{b}_6))$, and $(h_{17}, h_{18})=f_1(\tilde{b}_7, \tilde{b}_8)$. A rearrangement layer 1 may be a mapping from $h_1$ to $\tilde{h}_1$, where $\tilde{h}_1=[\tilde{h}_{11}, \tilde{h}_{12}, \tilde{h}_{13}, \tilde{h}_{14}, \tilde{h}_{15}, \tilde{h}_{16}, \tilde{h}_{17}, \tilde{h}_{18}]=[h_{11}, h_{13}, h_{12}, h_{14}, h_{15}, h_{17}, h_{16}, h_{18}]$. A neural network layer 2 may be 4 parallel neural networks sharing the same weights denoted by $f_2$, taking $\tilde{h}_1$ as input and outputting $h_2=[h_{21}, h_{22}, h_{23}, h_{24}, h_{25}, h_{26}, h_{27}, h_{28}]$. The mapping may be $(h_{21}, h_{22})=f_2(\tilde{h}_{11}, \tilde{h}_{12}))$ $(h_{23}, h_{24})=f_2(\tilde{h}_{13}, \tilde{h}_{14}))$, $(h_{25}, h_{26})=f_2(\tilde{h}_{15}, \tilde{h}_{16}))$, and $(h_{27}, h_{28})=f_2(\tilde{h}_{17}, \tilde{h}_{18}))$. A rearrangement layer 2 may be a mapping from $h_2$ to $\tilde{h}_2$, where $\tilde{h}_2=[\tilde{h}_{21}, \tilde{h}_{22}, \tilde{h}_{23}, \tilde{h}_{24}, \tilde{h}_{25}, \tilde{h}_{26}, \tilde{h}_{27}, \tilde{h}_{28}]=[h_{21}, h_{25}, h_{23}, h_{27}, h_{22}, h_{26}, h_{24}, h_{28}]$. A neural network 3 layer may be 4 parallel neural networks sharing the same weights denoted by $f_3$, taking $\tilde{h}_2$ as input, and outputting $h_3=[h_{31}, h_{32}, h_{33}, h_{34}, h_{35}, h_{36}, h_{37}, h_{38}]$. The mapping may be $(h_{31}, h_{32})=f_3(\tilde{h}_{21}, \tilde{h}_{22}))$ $(h_{33}, h_{34})=f_3(\tilde{h}_{23}, \tilde{h}_{24}))$, $(h_{35}, h_{36})=f_3(\tilde{h}_{25}, \tilde{h}_{26}))$, and $(h_{37}, h_{38})=f_3(\tilde{h}_{27}, \tilde{h}_{28})$. A rearrangement layer 3 may be a mapping from $h_3$ to the codeword x, where $$x=[x_1,x_2,x_3,x_4,x_5,x_6,x_7,x_8]=[h_{31},h_{33},h_{35},h_{37},h_{32},h_{34},h_{36},h_{38}].$$

Figure 15A:
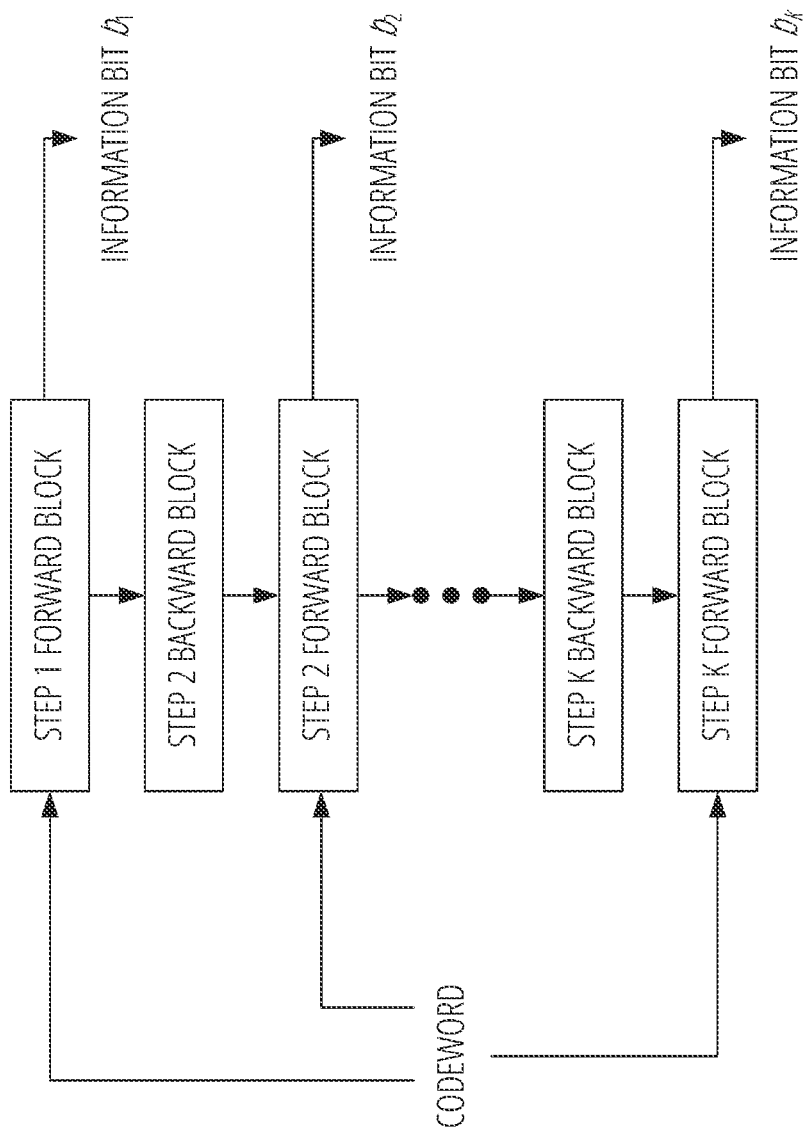
FIG. 15A is a schematic illustration of actions performed by a computing apparatus for mapping a codeword to a sequence of information bits, according to various aspects of the present disclosure.
Figure 15B:
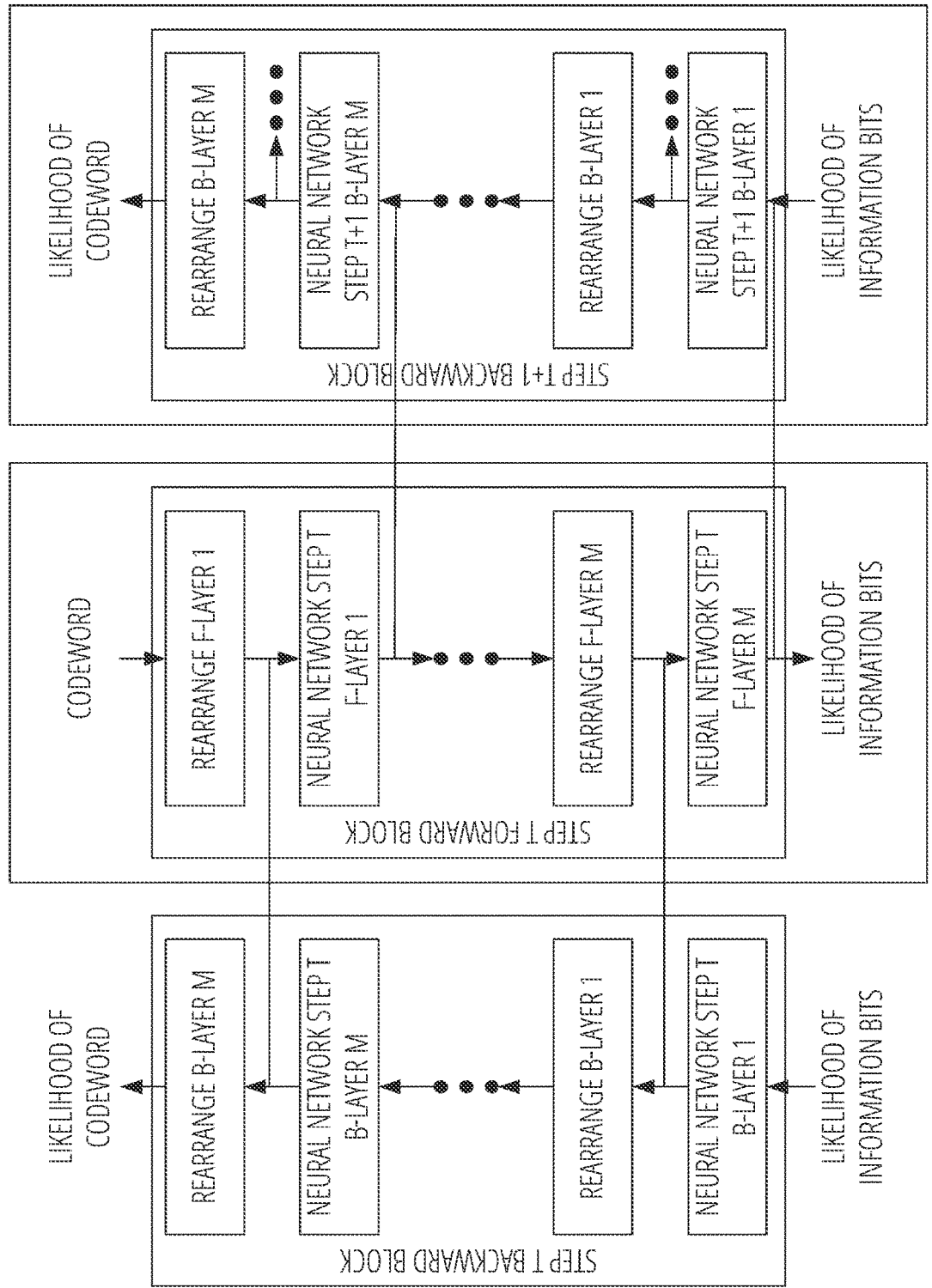
FIG. 15B is a schematic illustration of actions performed by a computing apparatus for performing the step t forward block and the step t+1 backward block as illustrated in FIG. 15A according to various aspects of the present disclosure.

FIG. 15A and FIG. 15B illustrate a non-limiting example embodiment of a decoder capable of decoding KO codes as described above, according to various aspects of the present disclosure.

FIG. 15A is a schematic illustration of actions performed by a computing apparatus for mapping a codeword to a sequence of information bits, according to various aspects of the present disclosure. A sequence of operations are performed over n steps that maps an n-dimensional codeword to a k-dimensional information bit sequence. Decoding first performs the first step of forward block, and then alternates k−1 times between backward blocks and forward blocks. Each forward block produces a decoded information bit starting from the first bit $b_1$ until the last bit $b_k$.

FIG. 15B is a schematic illustration of actions performed by a computing apparatus for performing the step t forward block and the step t+1 backward block as illustrated in FIG. 15A according to various aspects of the present disclosure. Step t forward block applies m alternating layers of rearrange operations and neural network operations. Rearrange operation applies a pre-determined permutation of the coordinates to n-dimensional vectors and the permutation is kept the same across different steps, but the permutation is different across the layers. Neural network layer applies a neural network to a 2n dimensional input and outputs an n dimensional vector.

Rearrange f-layer 1 takes an n dimensional vector c and outputs a d-dimensional vector $\tilde{h}_f^{(t,\,1)}$ after applying a permutation $\pi_f^{(1)}$ of the coordinates. Neural network step t f-layer 1 takes in $\tilde{h}_f^{(t,\,1)}$ from the rearrange f-layer 1 and $\tilde{h}_b^{(t,\,m)}$ from the previous step t backward block and outputs an n-dimensional vector $h_f^{(t,\,1)}$.

In the subsequent layers, rearrange f-layer $\}^\ell$ performs a permutation $\pi_f^{(\ell)}$ to the input $h_f^{t,\ell-1}$ and outputs $\tilde{h}_f^{(t,\,\ell)}$, and neural network step t f-layer $\}^\ell$ takes as input $\tilde{h}_f^{(t,\,\ell)}$ from the rearrange f-layer $\ell$ and $\tilde{h}_b^{(t,\,\ell)}$ from the previous step t backward block and outputs an n-dimensional vector $h_f^{(t,\,\ell)}$.

The final layer in outputs an n-dimensional vector $h_f^{(t,\,m)}$, which is the likelihood of the k information bits. The sign of the likelihood of the t-th information bit is the output $$b_t \in \{+1, -1\} = \text{sign}(h_{f,\sigma(t)}^{(t,m)})$$

where $\sigma(t)$ is the coordinate of the t-th information bit.

The step t+1 backward block applies m alternating layers of neural network operations and rearrange operations. Rearrange operation applies a pre-determined permutation of the coordinates to n-dimensional vectors and the permutation is kept the same across different steps, but the permutation is different across the layers. Neural network layer applies a neural network to a 2n dimensional input and outputs an n dimensional vector. The first neural network step t+1 b-layer 1 takes as input the likelihood of information bits $h_f^{(t, m)}$ from the step t forward block and outputs an n-dimensional vector $\tilde{h}_b^{(t+1, 1)}$. Rearrange b-layer 1 applies a permutation $\pi_b^{(1)}$ to the coordinates of $\tilde{h}_b^{(t+1, 1)}$ and outputs a permuted version $h_b^{(t+1, 1)}$. Subsequent rearrange and neural network layers are alternatively applied until the neural network step t+1 b-layer m outputs $\tilde{h}_b^{(t+1, m)}$. This is permuted by the rearrange b-layer m to output the likelihood of the codeword $h_b^{(t+1, m)}$.

In an embodiment, $x=[x_1, \ldots, x_8]$ is the codeword, m=3, all the neural network layers are fully connected 4 parallel neural networks, each taking a 4 dimensional input and outputting a 2 dimensional output except for the step 1 forward block where all neural networks take 2 dimensional inputs. In other embodiments, other values for m, other widths of codewords, other dimensions of inputs and/or outputs for the neural networks, and so on may be used.

Figure 16:
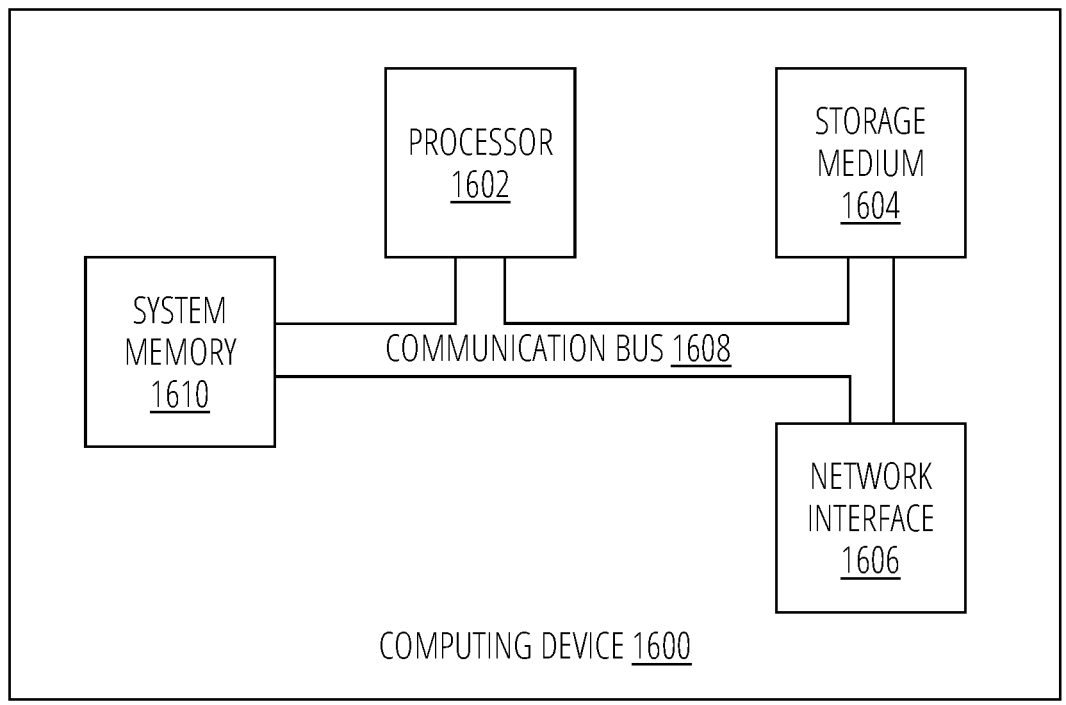
FIG. 16 is a block diagram that illustrates a non-limiting example embodiment of a computing device appropriate for use as a computing device with embodiments of the present disclosure.

FIG. 16 is a block diagram that illustrates aspects of an exemplary computing device 1600 appropriate for use as a computing device of the present disclosure. While multiple different types of computing devices were discussed above, the exemplary computing device 1600 describes various elements that are common to many different types of computing devices. While FIG. 16 is described with reference to a computing device that is implemented as a device on a network, the description below is applicable to servers, personal computers, mobile phones, smart phones, tablet computers, embedded computing devices, and other devices that may be used to implement portions of embodiments of the present disclosure. Some embodiments of a computing device may be implemented in or may include an application-specific integrated circuit (ASIC), a field-programmable gate array (FPGA), or other customized device. Moreover, those of ordinary skill in the art and others will recognize that the computing device 1600 may be any one of any number of currently available or yet to be developed devices.

In its most basic configuration, the computing device 1600 includes at least one processor 1602 and a system memory 1610 connected by a communication bus 1608. Depending on the exact configuration and type of device, the system memory 1610 may be volatile or nonvolatile memory, such as read only memory ("ROM"), random access memory ("RAM"), EEPROM, flash memory, or similar memory technology. Those of ordinary skill in the art and others will recognize that system memory 1610 typically stores data and/or program modules that are immediately accessible to and/or currently being operated on by the processor 1602. In this regard, the processor 1602 may serve as a computational center of the computing device 1600 by supporting the execution of instructions.

As further illustrated in FIG. 16, the computing device 1600 may include a network interface 1606 comprising one or more components for communicating with other devices over a network. Embodiments of the present disclosure may access basic services that utilize the network interface 1606 to perform communications using common network protocols. The network interface 1606 may also include a wireless network interface configured to communicate via one or more wireless communication protocols, such as Wi-Fi, 2G, 3G, LTE, WiMAX, Bluetooth, Bluetooth low energy, and/or the like. As will be appreciated by one of ordinary skill in the art, the network interface 1606 illustrated in FIG. 16 may represent one or more wireless interfaces or physical communication interfaces described and illustrated above with respect to particular components of the computing device 1600.

In the exemplary embodiment depicted in FIG. 16, the computing device 1600 also includes a storage medium 1604. However, services may be accessed using a computing device that does not include means for persisting data to a local storage medium. Therefore, the storage medium 1604 depicted in FIG. 16 is represented with a dashed line to indicate that the storage medium 1604 is optional. In any event, the storage medium 1604 may be volatile or nonvolatile, removable or nonremovable, implemented using any technology capable of storing information such as, but not limited to, a hard drive, solid state drive, CD ROM, DVD, or other disk storage, magnetic cassettes, magnetic tape, magnetic disk storage, and/or the like.

Suitable implementations of computing devices that include a processor 1602, system memory 1610, communication bus 1608, storage medium 1604, and network interface 1606 are known and commercially available. For ease of illustration and because it is not important for an understanding of the claimed subject matter, FIG. 16 does not show some of the typical components of many computing devices. In this regard, the computing device 1600 may include input devices, such as a keyboard, keypad, mouse, microphone, touch input device, touch screen, tablet, and/or the like. Such input devices may be coupled to the computing device 1600 by wired or wireless connections including RF, infrared, serial, parallel, Bluetooth, Bluetooth low energy, USB, or other suitable connections protocols using wireless or physical connections. Similarly, the computing device 1600 may also include output devices such as a display, speakers, printer, etc. Since these devices are well known in the art, they are not illustrated or described further herein.

While illustrative embodiments have been illustrated and described, it will be appreciated that various changes can be made therein without departing from the spirit and scope of the invention.

EXAMPLES

Example 1: A method of encoding a set of information bits to produce a codeword that encodes the set of information bits for reliable communication, the method comprising: receiving the set of information bits; providing the set of information bits to a plurality of permutation layers separated by neural network processing layers, wherein each permutation layer accepts an input vector and generates a reordered output vector that is a reordering of the input vector, and wherein each neural network processing layer accepts a vector of input values and generates a vector of output values based on a non-linear function of the vector of input values; and providing the reordered output vector of a final permutation layer of the plurality of permutation layers as the codeword.

Example 2: The method of Example 1, wherein each neural network processing layer includes a single neural network that accepts an entirety of the vector of input values.

Example 3: The method of any one of Example 1, wherein each neural network processing layer includes a plurality of neural networks that each accepts a subset of the vector of input values.

Example 4: The method of Example 3, wherein for a given neural network processing layer, weights of each neural network in the plurality of neural networks are the same.

Example 5: The method of any one of Examples 3-4, wherein each neural network of the plurality of neural networks accepts a pair of input values from the vector of input values as input.

Example 6: The method of any one of Examples 1-5, wherein at least one neural network processing layer of the neural network processing layers uses SeLU activation.

Example 7: The method of any one of Examples 1-6, further comprising adding one or more zero values to pad the set of information bits to a size expected by the plurality of permutation layers and the plurality of neural network layers.

Example 8: The method of any one of Examples 1-7, wherein the codeword is a real-valued vector.

Example 9: A method of decoding a codeword to retrieve a set of information bits, the method comprising: receiving the codeword; providing the codeword to a plurality of permutation layers separated by neural network processing layers, wherein each permutation layer accepts an input vector and generates a reordered output vector that is a reordering of the input vector, and wherein each neural network processing layer accepts a vector of input values and generates a vector of output values based on a non-linear function of the vector of input values; and performing a plurality of forward calculations and backward calculations using the plurality of permutation layers separated by the neural network processing layers to retrieve the set of information bits.

Example 10: The method of Example 9, wherein performing the plurality of forward calculations and backward calculations using the plurality of permutation layers separated by the neural network processing layers to retrieve the set of information bits includes: performing a forward calculation; extracting an information bit of the set of information bits from a result of the forward calculation; performing a backward calculation; and repeating at least the forward calculation to extract each information bit of the set of information bits.

Example 11: The method of Example 9, wherein performing the plurality of forward calculations and backward calculations using the plurality of permutation layers separated by the neural network processing layers to retrieve the set of information bits includes: performing the plurality of forward calculations and backward calculations; and extracting the set of information bits from a result of the plurality of forward calculations and backward calculations.

Example 12: The method of any one of Examples 9-11, wherein each neural network processing layer includes a single neural network that accepts an entirety of the vector of input values.

Example 13: The method of any one of Examples 9-11, wherein each neural network processing layer includes a plurality of neural networks that each accepts a subset of the vector of input values.

Example 14: The method of Example 13, wherein for a given neural network processing layer, weights of each neural network in the plurality of neural networks are the same.

Example 15: The method of any one of Examples 13-14, wherein each neural network of the plurality of neural networks accepts a pair of input values from the vector of input values as input.

Example 16: The method of any one of Examples 9-15, wherein at least one neural network processing layer of the neural network processing layers uses SeLU activation.

Example 17: The method of any one of Examples 9-17, further comprising removing one or more zero values from an output of the plurality of permutation layers separated by the neural network processing layers to retrieve the set of information bits.

Example 18: The method of any one of Examples 9-17, wherein the codeword is a real-valued vector.

Example 19: A method of reliable wireless transmission of a set of information bits, the method comprising: determining a set of information bits to be transmitted; encoding the set of information bits in a codeword; and wirelessly transmitting the codeword; wherein encoding the set of information bits in a codeword comprises a method as recited in any one of Example 1 to Example 8.

Example 20: A method of reliable wireless reception of a set of information bits, the method comprising: wirelessly receiving a codeword; and decoding a set of information bits from the codeword; wherein decoding the set of information bits from the codeword comprises a method as recited in any one of Example 9 to Example 18.

Example 21: A non-transitory computer-readable medium having computer-executable instructions stored thereon that, in response to execution by one or more processors of a computing device, cause the computing device to perform actions as recited in any one of Examples 1 to 20.

Example 22: A computing device, comprising: at least one processor; and a non-transitory computer-readable medium having computer-executable instructions stored thereon that, in response to execution by the at least one processor, cause the computing device to perform actions as recited in any one of Examples 1 to 20.

Example 23: A method of training an encoder and a decoder, the method comprising: initializing an encoder comprising a first plurality of first permutation layers separated by first neural network processing layers, wherein each first permutation layer accepts an input vector and generates a reordered output vector that is a reordering of the input vector, and wherein each first neural network processing layer accepts a vector of input values and generates a vector of output values based on a non-linear function of the vector of input values; initializing a decoder comprising a second plurality of second permutation layers separated by second neural network processing layers, wherein each second permutation layer accepts an input vector and generates a reordered output vector that is a reordering of the input vector, and wherein each second neural network processing layer accepts a vector of input values and generates a vector of output values based on a non-linear function of the vector of input values; performing a first number of optimization steps for the decoder using a set of training data; performing a second number of optimization steps for the encoder using the set of training data; and repeating the first number of optimization steps for the decoder and the second number of optimization steps for the encoder until training of the encoder and the decoder is completed.

Example 24: The method of Example 23, wherein the first number of optimization steps is greater than the second number of optimization steps.

Example 25: The method of any one of Examples 23-24, wherein each second permutation layer performs an opposite reordering to a corresponding first permutation layer.

Example 26: The method of any one of Examples 23-25, wherein initializing the encoder and the decoder includes randomly assigning weights for each first neural network processing layer and each second neural network processing layer.

Example 27: The method of any one of Examples 23-26, further comprising generating the set of training data by: generating a plurality of sets of source information bits; and applying a noise generator to each set of source information bits to generate a corresponding plurality of sets of noisy information bits; wherein the plurality of sets of source information bits are used as training input for the encoder and ground truth results for the decoder; and wherein the corresponding plurality of sets of noisy information bits are used as training input for the decoder.

Example 28: The method of any one of Examples 23-27, wherein performing at least one of the first number of optimization steps for the decoder and the second number of optimization steps for the encoder includes using stochastic gradient descent.

Example 29: The method of Example 28, wherein performing stochastic gradient descent includes using an Adam optimization technique.

Example 30: A non-transitory computer-readable medium having computer-executable instructions stored thereon that, in response to execution by one or more processors of a computing device, cause the computing device to perform actions as recited in any one of Examples 23 to 29.

Example 31: A computing device, comprising: at least one processor; and anon-transitory computer-readable medium having computer-executable instructions stored thereon that, in response to execution by the at least one processor, cause the computing device to perform actions as recited in any one of Examples 23 to 29.

The invention claimed is:

1. A method of encoding a set of information bits to produce a codeword that encodes the set of information bits for reliable communication, the method comprising:
   receiving the set of information bits;
   providing the set of information bits to a plurality of permutation layers separated by neural network processing layers, wherein each permutation layer accepts an input vector and generates a reordered output vector that is a reordering of the input vector, and wherein each neural network processing layer accepts a vector of input values and generates a vector of output values based on a non-linear function of the vector of input values; and
   providing the reordered output vector of a final permutation layer of the plurality of permutation layers as the codeword.

2. The method of claim 1, wherein each neural network processing layer includes a single neural network that accepts an entirety of the vector of input values.

3. The method of claim 1, wherein each neural network processing layer includes a plurality of neural networks that each accepts a subset of the vector of input values.

4. The method of claim 3, wherein for a given neural network processing layer, weights of each neural network in the plurality of neural networks are the same.

5. The method of claim 3, wherein each neural network of the plurality of neural networks accepts a pair of input values from the vector of input values as input.

6. The method of claim 1, wherein at least one neural network processing layer of the neural network processing layers uses SeLU activation.

7. The method of claim 1, further comprising adding one or more zero values to pad the set of information bits to a size expected by the plurality of permutation layers and the plurality of neural network layers.

8. The method of claim 1, wherein the codeword is a real-valued vector.

9. A method of reliable wireless transmission of a set of information bits, the method comprising:
   determining a set of information bits to be transmitted;
   encoding the set of information bits in a codeword; and
   wirelessly transmitting the codeword;
   wherein encoding the set of information bits in a codeword comprises a method as recited in claim 1.

10. A method of decoding a codeword to retrieve a set of information bits, the method comprising:
    receiving the codeword;
    providing the codeword to a plurality of permutation layers separated by neural network processing layers, wherein each permutation layer accepts an input vector and generates a reordered output vector that is a reordering of the input vector, and wherein each neural network processing layer accepts a vector of input values and generates a vector of output values based on a non-linear function of the vector of input values; and
    performing a plurality of forward calculations and backward calculations using the plurality of permutation layers separated by the neural network processing layers to retrieve the set of information bits.

11. The method of claim 10, wherein performing the plurality of forward calculations and backward calculations using the plurality of permutation layers separated by the neural network processing layers to retrieve the set of information bits includes:
    performing a forward calculation;
    extracting an information bit of the set of information bits from a result of the forward calculation;
    performing a backward calculation; and
    repeating at least the forward calculation to extract each information bit of the set of information bits.

12. The method of claim 10, wherein performing the plurality of forward calculations and backward calculations using the plurality of permutation layers separated by the neural network processing layers to retrieve the set of information bits includes:
    performing the plurality of forward calculations and backward calculations; and
    extracting the set of information bits from a result of the plurality of forward calculations and backward calculations.

13. The method of claim 10, wherein each neural network processing layer includes a single neural network that accepts an entirety of the vector of input values.

14. The method of claim 10, wherein each neural network processing layer includes a plurality of neural networks that each accepts a subset of the vector of input values.

15. The method of claim 14, wherein for a given neural network processing layer, weights of each neural network in the plurality of neural networks are the same.

16. The method of claim 14, wherein each neural network of the plurality of neural networks accepts a pair of input values from the vector of input values as input.

17. The method of claim 10, wherein at least one neural network processing layer of the neural network processing layers uses SeLU activation.

18. The method of claim 10, further comprising removing one or more zero values from an output of the plurality of permutation layers separated by the neural network processing layers to retrieve the set of information bits.

19. The method of claim 10, wherein the codeword is a real-valued vector.

20. A method of reliable wireless reception of a set of information bits, the method comprising:
- wirelessly receiving a codeword; and
- decoding a set of information bits from the codeword;
- wherein decoding the set of information bits from the codeword comprises a method as recited in claim 10.

* * * * *